US012796361B2

(12) United States Patent
Matsubara et al.

(10) Patent No.: US 12,796,361 B2
(45) Date of Patent: Nov. 10, 2026

(54) ETCHING METHOD AND PLASMA PROCESSING SYSTEM

(71) Applicant: Tokyo Electron Limited, Tokyo (JP)

(72) Inventors: Ryo Matsubara, Kurokawa-gun (JP); Atsushi Takahashi, Kurokawa-gun (JP); Yuta Nakane, Kurokawagun (JP); Noboru Saito, Kurokawa-gun (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 251 days.

(21) Appl. No.: 18/479,599

(22) Filed: Oct. 2, 2023

(65) Prior Publication Data

US 2024/0112922 A1 Apr. 4, 2024

(30) Foreign Application Priority Data

Oct. 3, 2022 (JP) ................................. 2022-159564

(51) Int. Cl.

| | |
|---|---|
| ***H10P 50/28*** | (2026.01) |
| ***H01J 37/32*** | (2006.01) |
| ***H10P 50/00*** | (2026.01) |
| ***H10P 50/26*** | (2026.01) |

(52) U.S. Cl.

CPC ...... *H10P 50/283* (2026.01); *H01J 37/32899* (2013.01); *H10P 50/267* (2026.01); *H10P 50/71* (2026.01); *H10P 50/73* (2026.01); *H01J 37/32091* (2013.01); *H01J 37/321* (2013.01); *H01J 2237/332* (2013.01); *H01J 2237/334* (2013.01)

(58) Field of Classification Search

None

See application file for complete search history.

(56) References Cited

U.S. PATENT DOCUMENTS

| | | | | |
|---|---|---|---|---|
| 9,673,058 | B1 | 6/2017 | Briggs et al. | |
| 10,361,092 | B1 * | 7/2019 | Roberts | H01L 21/31144 |
| 2020/0126804 | A1 * | 4/2020 | Dole | H10P 50/283 |
| 2021/0005472 | A1 * | 1/2021 | Kanarik | H01L 21/67109 |
| 2021/0242032 | A1 * | 8/2021 | Colinjivadi | H01L 21/31144 |

FOREIGN PATENT DOCUMENTS

| | | |
|---|---|---|
| JP | 2016-021546 A | 2/2016 |
| JP | 2022-002337 A | 1/2022 |

* cited by examiner

*Primary Examiner* — Stephanie P Duclair

(74) *Attorney, Agent, or Firm* — PROCOPIO, CORY, HARGREAVES & SAVITCH LLP

(57) ABSTRACT

In one exemplary embodiment, there is provided an etching method. The method includes (a) preparing a substrate, the substrate comprising a silicon-containing film and a mask, the silicon-containing film including a recess, the mask being provided on the silicon-containing film and including an opening that exposes the recess; (b) forming a carbon-containing film on a side wall of the silicon-containing film, the side wall defining the recess; and (c) by using a plasma generated from a processing gas, forming a protective film containing tungsten on the carbon-containing film and etching the silicon-containing film in the recess, the processing gas including a fluorine-containing gas and a tungsten-containing gas.

20 Claims, 12 Drawing Sheets

ETCHING METHOD AND PLASMA PROCESSING SYSTEM

CROSS-REFERENCE TO RELATED APPLICATION

The present application claims priority under 35 U.S.C. § 119 to Japanese Patent Application No. 2022-159564 filed on Oct. 3, 2022, the entire contents of which are incorporated herein by reference.

BACKGROUND

Field

Exemplary embodiments of the present disclosure relate to an etching method and a plasma processing system.

Description of Related Art

JP2016-21546A discloses a method of etching a substrate in which a polysilicon mask is formed on a silicon-containing film.

SUMMARY

One embodiment of the present disclosure provides an etching method including (a) preparing a substrate, the substrate comprising a silicon-containing film and a mask, the silicon-containing film including a recess, the mask being provided on the silicon-containing film and including an opening that exposes the recess; (b) forming a carbon-containing film on a side wall of the silicon-containing film, the side wall defining the recess; and (c) by using a plasma generated from a processing gas, forming a protective film containing tungsten on the carbon-containing film and etching the silicon-containing film in the recess, the processing gas including a fluorine-containing gas and a tungsten-containing gas.

DETAILED DESCRIPTION

Figure 1:
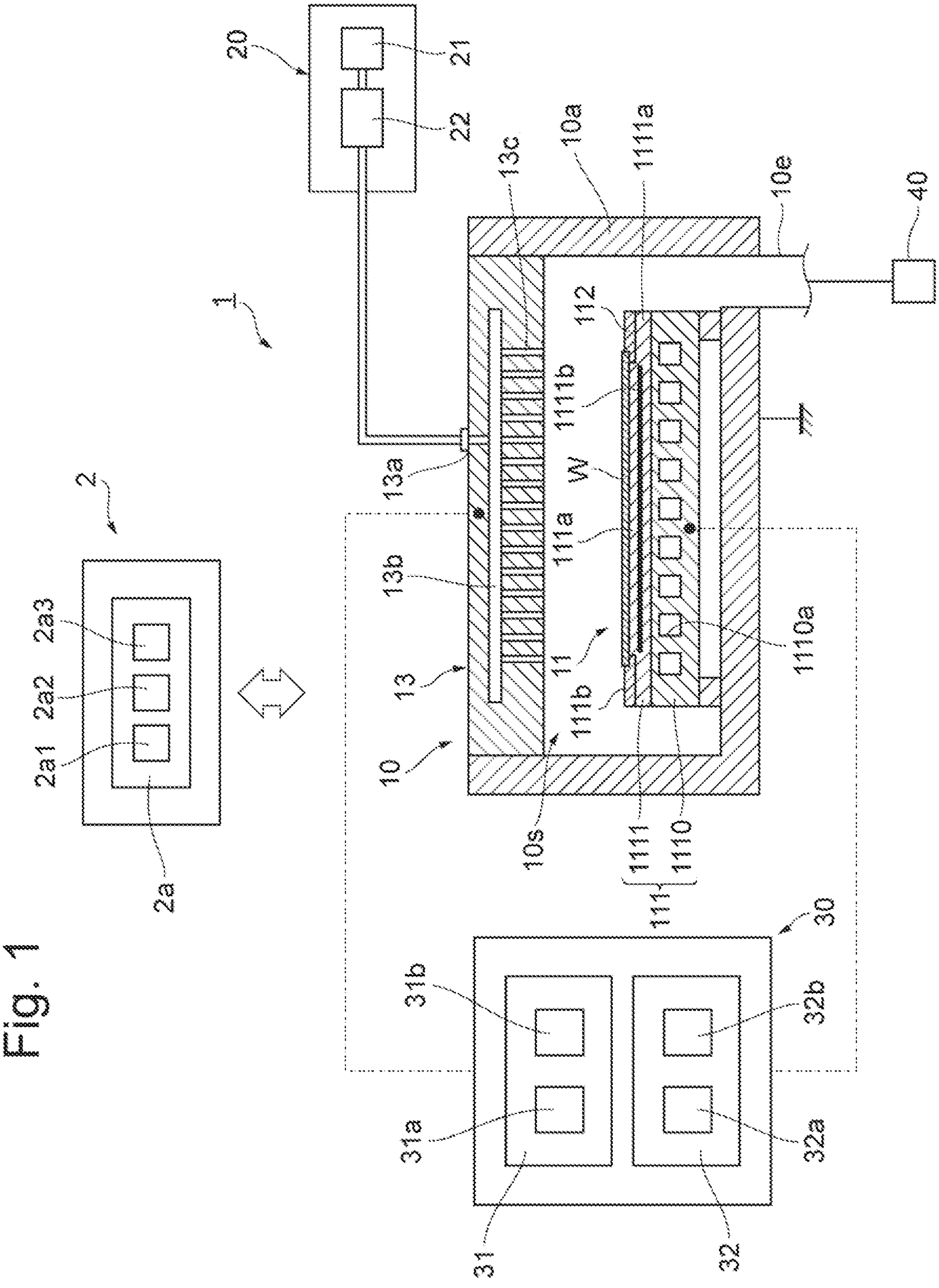
FIG. 1 is a diagram for describing a configuration example of a capacitively-coupled plasma processing apparatus.

The following describes embodiments of the present disclosure.

One exemplary embodiment provides an etching method including (a) preparing a substrate, the substrate comprising a silicon-containing film and a mask, the silicon-containing film including a recess, the mask being provided on the silicon-containing film and including an opening that exposes the recess; (b) forming a carbon-containing film on a side wall of the silicon-containing film, the side wall defining the recess; and (c) by using a plasma generated from a processing gas, forming a protective film containing tungsten on the carbon-containing film and etching the silicon-containing film in the recess, the processing gas including a fluorine-containing gas and a tungsten-containing gas.

In one exemplary embodiment, in (b), the carbon-containing film is formed from a side wall of the mask that defines an opening to at least a portion of the side wall of the silicon-containing film.

In one exemplary embodiment, in (b), the carbon-containing film is not formed on a bottom surface of the silicon-containing film that defines the recess.

In one exemplary embodiment, in (b), the carbon-containing film is also formed on the bottom surface of the silicon-containing film that defines the recess.

In one exemplary embodiment, in (b), the protective film is preferentially formed on the carbon-containing film on the side wall of the silicon-containing film.

In one exemplary embodiment, a cycle including (b) and (c) is repeated a plurality of times.

In one exemplary embodiment, (b) is executed in a first chamber, and (c) is executed in a second chamber different from the first chamber.

One exemplary embodiment further includes, after (b), transporting the substrate from the first chamber to the second chamber via a transport chamber, in which pressure inside the transport chamber is lower than pressure outside the transport chamber.

In one exemplary embodiment, (a) includes forming the recess in the silicon-containing film in the second chamber by etching using a plasma generated from a processing gas including a fluorine-containing gas.

In one exemplary embodiment, a temperature of a substrate support in the first chamber that supports the substrate in (b) is higher than a temperature of the substrate support in the second chamber that supports the substrate in (c).

In one exemplary embodiment, (b) includes generating a plasma from a processing gas including a nitrogen-containing gas and generating a plasma from a processing gas containing a carbon-containing gas.

In one exemplary embodiment, the carbon-containing gas is a hydrocarbon gas.

In one exemplary embodiment, (b) is executed by generating an inductively-coupled plasma, and (c) is executed by generating a capacitively-coupled plasma.

In one exemplary embodiment, in (c), the fluorine-containing gas includes at least one of a hydrogen fluoride gas and a hydrofluorocarbon gas.

In one exemplary embodiment, in (c), the processing gas further includes a phosphorus-containing gas.

In one exemplary embodiment, in (c), the processing gas further includes a carbon-containing gas.

In one exemplary embodiment, in (c), the temperature of the substrate support that supports the substrate is 0° C. or lower.

In one exemplary embodiment, the silicon-containing film is a silicon oxide film, a silicon nitride film, a polycrystalline silicon film, or a film stack containing two or more of the silicon oxide film, the silicon nitride film, and the polycrystalline silicon film.

In one exemplary embodiment, the mask is either a carbon-containing film or a metal-containing film.

One exemplary embodiment provides a plasma processing system comprising a plasma processing apparatus including a chamber; and a controller configured to cause (a) preparing a substrate, the substrate comprising a silicon-containing film and a mask, the silicon-containing film including a recess, the mask being provided on the silicon-containing film and including an opening that exposes the recess, (b) forming a carbon-containing film on a side wall of the silicon-containing film, the side wall defining the recess, and (c) by using a plasma generated from a processing gas, forming a protective film containing tungsten on the carbon-containing film and etching the silicon-containing film in the recess, the processing gas including a fluorine-containing gas and a tungsten-containing gas.

Embodiment of the present disclosure will be described below in detail with reference to the drawings. In each drawing, the same or similar elements are denoted by the same reference signs, and repetitive descriptions will be omitted. Unless otherwise specified, a positional relationship such as up, down, left, and right will be described based on the positional relationship illustrated in the drawings. The dimensional ratio in the drawings does not indicate an actual ratio, and the actual ratio is not limited to the ratio illustrated in the drawings.

Configuration Example of Plasma Processing System

Hereinafter, an example of the configuration example of a plasma processing system will be described. FIG. 1 is a view for explaining an example of a configuration of a capacitively-coupled plasma processing apparatus.

The plasma processing system includes a capacitively-coupled plasma processing apparatus 1 and a controller 2. The capacitively-coupled plasma processing apparatus 1 includes a plasma processing chamber 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10*s* defined by the shower head 13, a sidewall 10*a* of the plasma processing chamber 10, and the substrate support 11. The plasma processing chamber 10 has at least one gas supply port for supplying at least one processing gas into the plasma processing space 10*s*, and at least one gas exhaust port for exhausting the gas from the plasma processing space. The plasma processing chamber 10 is grounded. The shower head 13 and the substrate support 11 are electrically insulated from a housing of the plasma processing chamber 10.

The substrate support 11 includes a main body 111 and a ring assembly 112. The main body portion 111 has a central region 111*a* for supporting the substrate W and an annular region 111*b* for supporting the ring assembly 112. The wafer is an example of the substrate W. The annular region 111*b* of the main body 111 surrounds the central region 111*a* of the main body 111 in a plan view. The substrate W is disposed on the central region 111*a* of the main body 111 and the ring assembly 112 is disposed on the annular region 111*b* of the main body 111 to surround the substrate W on the central region 111*a* of the main body 111. Accordingly, the central region 111*a* is also referred to as a substrate support surface for supporting the substrate W, and the annular region 111*b* is also referred to as a ring support surface for supporting the ring assembly 112.

In one embodiment, the main body 111 includes a base 1110 and an electrostatic chuck 1111. The base 1110 includes a conductive member. The conductive member of the base 1110 functions as a lower electrode. The electrostatic chuck 1111 is disposed on the base 1110. The electrostatic chuck 1111 includes a ceramic member 1111*a* and an electrostatic electrode 1111*b* disposed in the ceramic member 1111*a*. The ceramic member 1111*a* has a central region 111*a*. In one embodiment, the ceramic member 1111*a* also has an annular region 111*b*. Other members that surround the electrostatic chuck 1111, such as an annular electrostatic chuck and an annular insulating member, may have the annular region 111*b*. In this case, the ring assembly 112 may be disposed on the annular electrostatic chuck or the annular insulating member, or may be disposed on both the electrostatic chuck 1111 and the annular insulating member. Further, at least one RF/DC electrode coupled to a radio frequency (RF) power source 31 and/or a direct current (DC) power source 32 to be described below may be disposed inside the ceramic member 1111*a*. In this case, at least one RF/DC electrode functions as the lower electrode. In a case where the bias RF signal and/or the DC signal to be described later are supplied to at least one RF/DC electrode, the RF/DC electrode is also referred to as a bias electrode. The conductive member of the base 1110 and at least one RF/DC electrode may function as a plurality of lower electrodes. Further, the electrostatic electrode 1111*b* may function as the lower electrode. Accordingly, the substrate support 11 includes at least one lower electrode.

The ring assembly 112 includes one or more annular members. In one embodiment, one or more annular members include one or more edge rings and at least one cover ring. The edge ring is formed of a conductive material or an insulating material, and the cover ring is formed of an insulating material.

Further, the substrate support 11 may include a temperature control module configured to adjust at least one of the electrostatic chuck 1111, the ring assembly 112, and the substrate to a target temperature. The temperature control module may include a heater, a heat transfer medium, a flow path 1110*a*, or a combination thereof. A heat transfer fluid, such as brine or gas, flows through the flow path 1110*a*. In one embodiment, the flow path 1110*a* is formed inside the base 1110, and one or more heaters are disposed in the ceramic member 1111*a* of the electrostatic chuck 1111. Further, the substrate support 11 may include a heat transfer gas supply configured to supply a heat transfer gas to a gap between the rear surface of the substrate W and the central region 111*a*.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes at least one upper electrode. The gas introduction unit may include, in addition to the shower head 13, one or a plurality of side gas injectors (SGI) that are attached to one or a plurality of openings formed in the sidewall 10*a*.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to plasma processing chamber 10 via at least one impedance matching circuit. The RF power source 31 is configured to supply at least one RF signal (RF power) to at least one lower electrode and/or at least one upper electrode. As a result, plasma is formed from at least one processing gas supplied into the plasma processing space 10*s*. Accordingly, the RF power source 31 may function as at least a portion of a plasma generator configured to generate plasma from one or more processing gases in the plasma processing chamber 10. Further, by supplying the bias RF signal (bias signal) to the at least one lower electrode, a bias potential (bias power) is generated in the substrate W, making it possible to draw ion components in the formed plasma into the substrate W.

In one embodiment, the RF power source 31 includes a first RF generator 31*a* and a second RF generator 31*b*. The first RF generator 31*a* is configured to be coupled to at least one lower electrode and/or at least one upper electrode via at least one impedance matching circuit to generate a source RF signal (source RF power) for plasma generation. In one embodiment, the source RF signal has a frequency in the range of 10 MHz to 150 MHz. In one embodiment, the first RF generator 31*a* may be configured to generate a plurality of source RF signals having different frequencies. The generated one or more source RF signals are supplied to at least one lower electrode and/or at least one upper electrode.

The second RF generator 31*b* is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a lower frequency than the frequency of the source RF signal. In one embodiment, the bias RF signal has a frequency in the range of 100 kHz to 60 MHz. In one embodiment, the second RF generator 31*b* may be configured to generate a plurality of bias RF signals having different frequencies. The generated one or more bias RF signals are supplied to at least one lower electrode. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32*a* and a second DC generator 32*b*. In one embodiment, the first DC generator 32*a* is configured to be connected to at least one lower electrode to generate the first DC signal. The generated first bias DC signal is applied to at least one lower electrode. In one embodiment, the second DC generator 32*b* is configured to be connected to at least one upper electrode to generate a second DC signal. The generated second DC signal is applied to at least one upper electrode.

In various embodiments, at least one of the first and second DC signals may be pulsed. In this case, the sequence of voltage pulses is applied to at least one lower electrode and/or at least one upper electrode. The voltage pulse may have a pulse waveform of a rectangle, a trapezoid, a triangle or a combination thereof. In one embodiment, a waveform generator for generating a sequence of voltage pulses from the DC signal is connected between the first DC generator 32*a* and at least one lower electrode. Accordingly, the first DC generator 32*a* and the waveform generator configure a voltage pulse generator. In a case where the second DC generator 32*b* and the waveform generator configure the voltage pulse generator, the voltage pulse generator is connected to at least one upper electrode. The voltage pulse may have a positive polarity or a negative polarity. Further, the sequence of the voltage pulses may include one or more positive voltage pulses and one or more negative voltage pulses in one cycle. The first and second DC generators 32*a* and 32*b* may be provided in addition to the RF power source 31, and the first DC generator 32*a* may be provided instead of the second RF generator 31*b*.

The exhaust system 40 may be connected to, for example, a gas exhaust port 10*e* disposed at a bottom portion of the plasma processing chamber 10. The exhaust system 40 may include a pressure adjusting valve and a vacuum pump. The pressure in the plasma processing space 10*s* is adjusted by the pressure adjusting valve. The vacuum pump may include a turbo molecular pump, a dry pump, or a combination thereof.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include a processor 2*a*1, a storage unit 2*a*2, and a communication interface 2*a*3. The controller 2 is implemented by, for example, a computer 2*a*. The processor 2*a*1 may be configured to read a program from the storage unit 2*a*2 and perform various control operations by executing the read program. The program may be stored in advance in the storage unit 2*a*2, or may be acquired via a medium when necessary. The acquired program is stored in the storage unit 2*a*2, and is read from the storage unit 2*a*2 and executed by the processor 2*a*1. The medium may be various storing media readable by the computer 2*a*, or may be a communication line connected to the communication interface 2*a*3. The processor 2*a*1 may be a Central Processing Unit (CPU). The storage 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN).

Example of Plasma Processing Method

Figure 2:
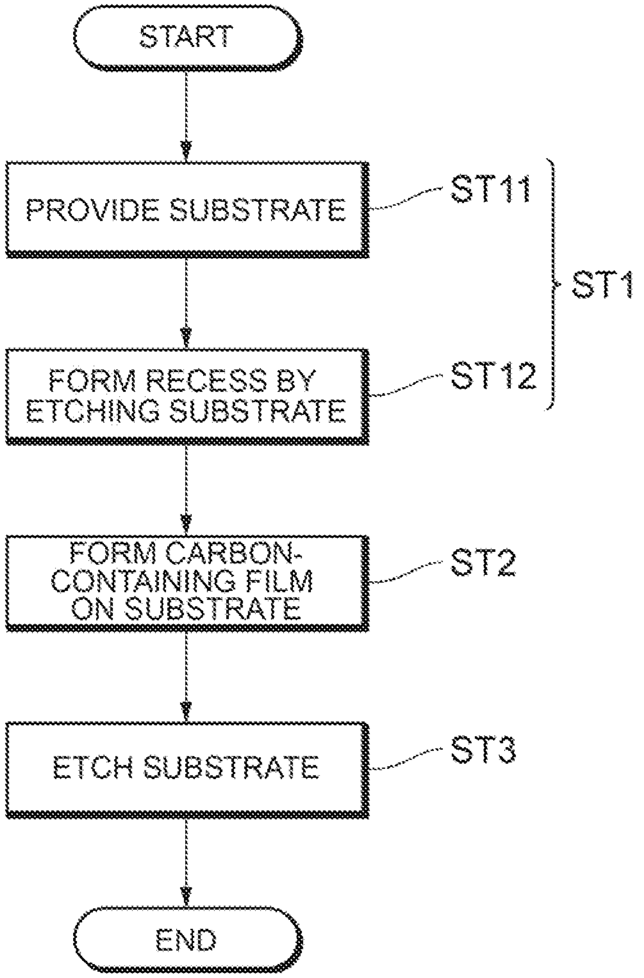
FIG. 2 is a flowchart illustrating an example of the present processing method.

FIG. 2 is a flowchart illustrating an example of a plasma processing method (also referred to as "the present processing method" below) according to an exemplary embodiment. As illustrated in FIG. 2, the present processing method includes Step ST1 of preparing a substrate, Step ST2 of forming a carbon-containing film on the substrate, and Step ST3 of etching the substrate. The processing in each step may be executed by the plasma processing system illustrated in FIG. 1. A case where the controller 2 controls each unit of a plasma processing apparatus 1 to perform the present processing method on a substrate W will be described below as an example.

Step ST1: Preparation of Substrate

As illustrated in FIG. 2, Step ST1 includes Step ST11 of providing a substrate W and Step ST12 of forming a recess by etching the substrate W. First, in Step ST11, the substrate W is provided in a plasma processing space 10*s* of the plasma processing apparatus 1. The substrate W is provided on the central region 111*a* of the substrate support 11. The substrate W is held by the substrate support 11 by an electrostatic chuck 1111.

Figure 3:
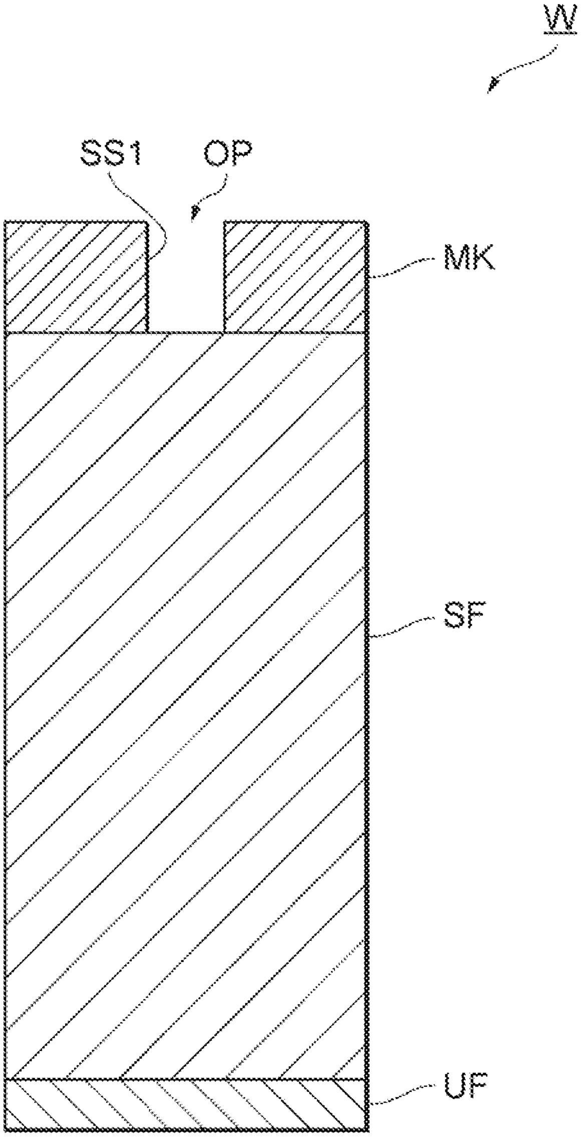
FIG. 3 is a diagram illustrating an example of a cross-sectional structure of a substrate provided in Step ST11.

FIG. 3 is a diagram illustrating an example of a cross-sectional structure of the substrate W provided in Step ST11. As illustrated in FIG. 3, the substrate W includes a silicon-containing film SF and a mask MK formed on the silicon-containing film SF. The silicon-containing film SF may be formed on an underlying film UF. The substrate W may be used to manufacture a semiconductor device. The semiconductor device includes, for example, a semiconductor memory device such as a DRAM or a 3D-NAND flash memory.

The underlying film UF is, for example, a silicon wafer, an organic film, a dielectric film, a metal film, a semiconductor film, or the like formed on a silicon wafer. The underlying film UF may be configured by stacking a plurality of films.

The silicon-containing film SF is a film to be etched by the present processing method. The silicon-containing film SF may be, for example, a silicon oxide film, a silicon nitride film, a silicon oxynitride film, a silicon carbonitride film, a polycrystalline silicon film, or a carbon-containing silicon film. The silicon-containing film SF may be configured by stacking a plurality of films. For example, the silicon-containing film SF may be configured by alternately stacking silicon oxide films and silicon nitride films. For example, the silicon-containing film SF may be configured by alternately stacking silicon oxide films and polycrystalline silicon films. For example, the silicon-containing film SF may be a film stack including a silicon nitride film, a silicon oxide film, and a polycrystalline silicon film. For example, the silicon-containing film SF may be configured by stacking a silicon oxide film and a silicon carbonitride film. For example, the silicon-containing film SF may be a film stack including a silicon oxide film, a silicon nitride film, and a silicon carbonitride film.

The mask MK is formed from a material of which an etching rate for the plasma generated in Step ST12 or Step ST3 is lower than the etching rate of the silicon-containing film SF. The mask MK may be formed from a carbon-containing material, for example. In one example, the mask MK is an amorphous carbon film, a photoresist film, or a spin-on carbon film (SOC film). The mask MK may be, for example, a metal-containing film containing at least one metal selected from the group consisting of tungsten, molybdenum, titanium, and ruthenium. In one example, the mask MK includes tungsten carbide or tungsten silicide. The mask MK may be a single-layer mask including one layer, or may be a multilayer mask including two or more layers.

As illustrated in FIG. 3, the mask MK defines at least one opening UP on the silicon-containing film SF. The opening OP is a space on the silicon-containing film SF and is surrounded by a side wall SS1 of the mask MK. That is, an upper surface of the silicon-containing film SF has a region covered by the mask MK and a region exposed at the bottom of the opening OP.

The opening OP may have any shape in plan view of the substrate W, that is, when the substrate W is viewed in a direction from the top to the bottom of FIG. 3. The shape may be, for example, a circle, an ellipse, a rectangle, a line, or a shape in which one or more of the figures are combined. The mask MK may have a plurality of side walls, and the plurality of side walls may define a plurality of openings OP. The plurality of opening OP may each have a linear shape, and may be arranged at predetermined intervals to form a line & space pattern. Further, the plurality of openings OP may each have a hole shape, and may form an array pattern.

Each of the films (underlying film UF, silicon-containing film SF, and mask MK) constituting the substrate W may be formed by a CVD method, an ALD method, a spin coating method, or the like. The mask MK may be formed by lithography. The opening OP of the mask MK may be formed by etching the mask MK. Each of the films may be a flat film or a film having unevenness. The substrate W may further have another film under the underlying film UF. In this case, a recess having a shape corresponding to the opening OP may be formed in the silicon-containing film SF and the underlying film UF, and this other film may be used as a mask for etching.

At least a portion of a process of forming each film of the substrate W may be executed in the space of the plasma processing chamber 10. In one example, when the mask MK is etched to form the opening OP, this step may be executed in the plasma processing chamber 10. That is, the etching of the opening OP and the silicon-containing film SF in Step ST12, which will be described later, may be continuously executed in the same chamber. Further, after the entirety of each film of the substrate W is formed by an external device or a chamber of the plasma processing apparatus 1, the substrate W is carried into the plasma processing space 10*s* of the plasma processing apparatus 1 and is disposed on the substrate support 11. In this manner, the substrate W may be provided.

After the substrate W is provided to the central region 111*a* of the substrate support 11, the temperature of the substrate support 11 is adjusted to a setting temperature by a temperature control module. The setting temperature may be, for example, a temperature of 70° C. or lower (for example, room temperature). Further, for example, the setting temperature may be 0° C. or lower, −10° C. or lower, −20° C. or lower, −30° C. or lower, −40° C. or lower, −50° C. or lower, −60° C. or lower, or −70° C. or lower. Further, for example, the setting temperature may be −10° C. or higher, −20° C. or higher, −30° C. or higher, −40° C. or higher, −50° C. or higher, −60° C. or higher, −70° C. or higher, or −80° C. or higher. In one example, adjusting or maintaining the temperature of the substrate support 11 includes setting a temperature of a heat transfer fluid flowing in a flow path 1110*a* or a heater temperature to the setting temperature, or to a temperature different from the setting temperature. A timing at which the heat transfer fluid starts to flow in the flow path 1110*a* may be before or after the substrate W is placed on the substrate support 11, or may be the same as the time when the substrate W is placed on the substrate support 11. Further, the temperature of the substrate support 11 may be adjusted to the setting temperature before Step ST11. That is, the substrate W may be provided to the substrate support 11 after the temperature of the substrate support 11 is adjusted to the setting temperature.

Then, in Step ST12, the silicon-containing film SF is etched by using a plasma generated from a first processing gas. First, the first processing gas is supplied from the gas supply 20 to the plasma processing space 10*s*. The first processing gas may be selected such that the silicon-containing film SF is allowed to be etched with a sufficient selectivity for the mask MK. The first processing gas may include one or a plurality of gases of the same type as a third processing gas used in the etching of Step ST3 to be described later. The first processing gas may include a fluorine-containing gas. The first processing gas may further include one or more gases selected from the group consisting of a phosphorus-containing gas, a carbon-containing gas, a halogen-containing gas other than fluorine, an inert gas, and a metal-containing gas such as tungsten. The first processing gas may not include a metal-containing gas such as tungsten or the like.

During the processing in Step ST12, a gas included in the first processing gas and the flow rate (divided pressure) of this gas may be changed or may not be changed. For example, when the silicon-containing film SF is configured by a film stack including different types of silicon-containing films, the configuration of the processing gas and the flow rate of each gas may be changed with the progress of etching, that is, depending on the type of film to be etched. During the processing in Step ST12, the temperature of the substrate support 11 may be maintained at the setting temperature adjusted in Step ST11. The setting temperature of the substrate support 11 may be changed in accordance with the type of the first processing gas and/or the silicon-containing film and the like. For example, when the first processing gas includes a fluorine-containing gas, the setting temperature of the substrate support 11 is 0° C. or lower.

Then, the source RF signal is applied to the lower electrode of the substrate support 11 and/or the upper electrode of the shower head 13. As a result, an RF electric field is generated between the shower head 13 and the substrate support 11, and a plasma is generated from the processing gas in the plasma processing space 10*s*. A portion (portion exposed in the opening OP) of the silicon-containing film SF, which is not covered by the mask MK, is etched by active species such as ions and radicals in the plasma. Etching in Step ST12 is continued until a recess RC has a given depth. The etching in Step ST12 is ended at least before the underlying film UF is exposed.

Figure 4:
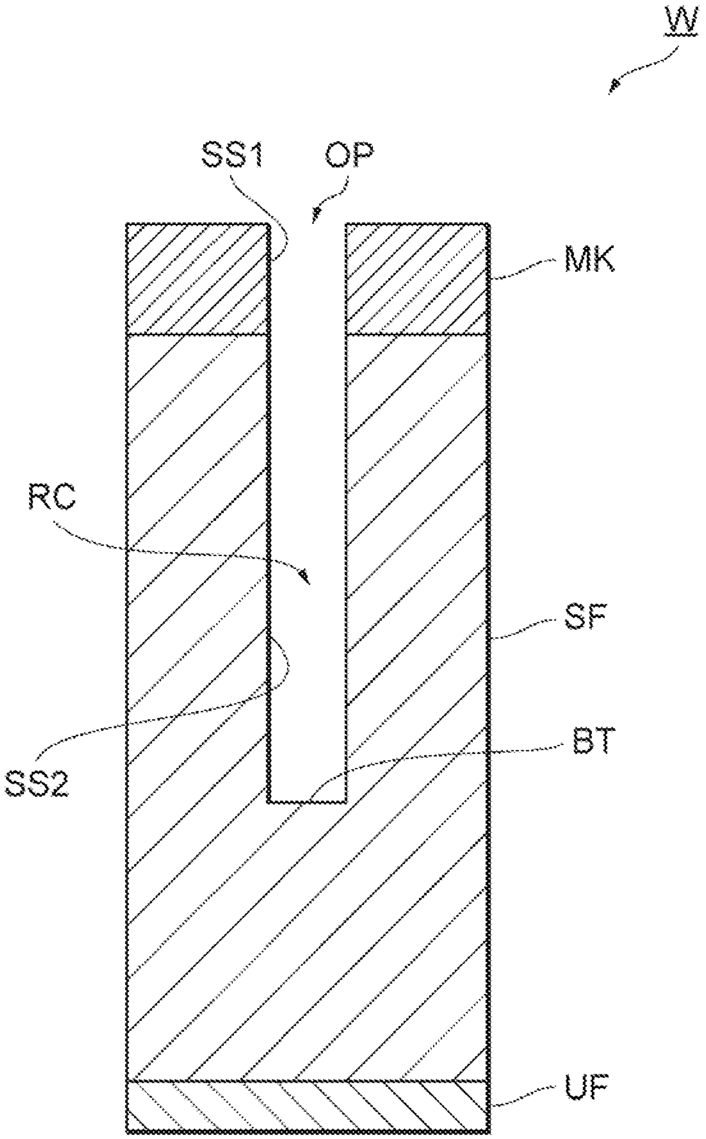
FIG. 4 is a diagram illustrating an example of a cross-sectional structure of the substrate after processing in Step ST12.

FIG. 4 is a diagram illustrating an example of a cross-sectional structure of the substrate W after the processing in Step ST12. As illustrated in FIG. 4, due to the etching in Step ST12, an exposed portion of the silicon-containing film SF at the opening OP is etched in a depth direction (direction from the top to the bottom in FIG. 4), and thus the recess RC is formed.

The bias signal may be applied to the lower electrode of the substrate support 11 in Step ST12. The bias signal may be a bias RF signal supplied from the second RF generator 31*b*. The bias signal may be a bias DC signal supplied from the DC generator 32*a*.

Figure 5:
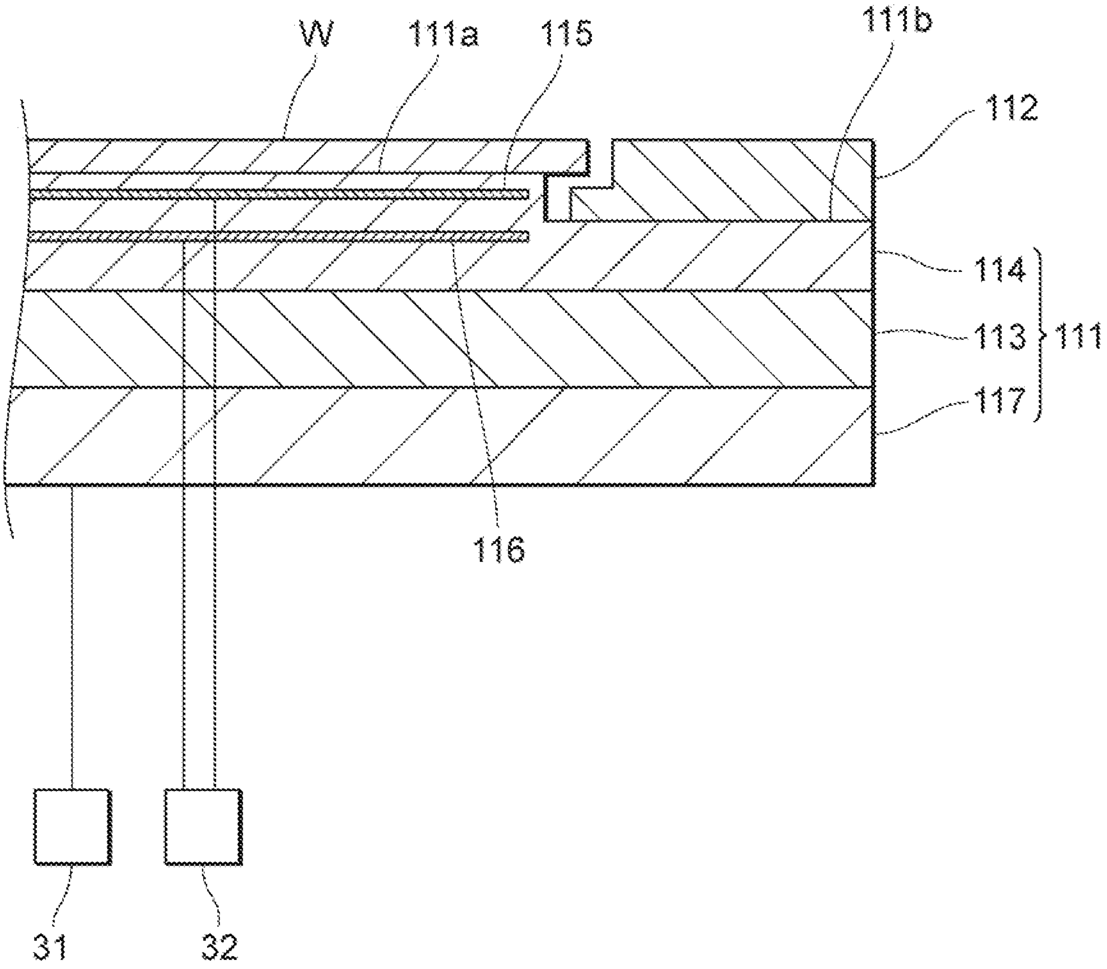
FIG. 5 is a partially enlarged view illustrating an example of a substrate support.

FIG. 5 is a partially enlarged view illustrating an example of the substrate support 11. The substrate support 11 includes a main body 111 and a ring assembly 112. The main body 111 includes a base 113, an electrostatic chuck 114, and an electrode plate 117. The main body 111 has a central region (substrate support surface) 111*a* for supporting the substrate W and an annular region (ring support surface) 111*b* for supporting the ring assembly 112. The annular region 111*b* of the main body 111 surrounds the central region 111*a* of the main body 111 in plan view. The substrate W is disposed on the central region 111*a* of the main body 111. The ring assembly 112 is disposed on the annular region 111*b* of the main body 111 to surround the substrate W on the central region 111*a* of the main body 111. The base 113 may include a conductive member. The conductive member of the base 113 may function as the lower electrode. The electrostatic chuck 114 is disposed on the base. An upper surface of the electrostatic chuck 114 has the substrate support surface 111*a*. The ring assembly 112 includes one or a plurality of annular members. At least one of the one or the plurality of annular members is an edge ring.

The electrostatic chuck 114 includes a chuck electrode 115 and a bias electrode 116 inside the electrostatic chuck 114. The chuck electrode 115 or the bias electrode 116 corresponds to the electrostatic electrode 1111*b*. The chuck electrode 115 includes an electrode 115 provided between the substrate support surface 111*a* and the base 113. The electrode 115 may be a flat electrode corresponding to the shape of the substrate support surface 111*a*. The bias electrode 116 is provided between the electrode 115 (or the substrate support surface 111*a*) and the base 113. The electrode 116 may be a flat electrode corresponding to the shape of the substrate support surface 111*a* and/or the electrode 115.

When the conductive member included in the base 113 functions as the lower electrode, the electrostatic chuck 114 may not include the bias electrode 116. The chuck electrode 115 may also function as the lower electrode. When the chuck electrode 115 functions as the lower electrode, the electrostatic chuck 114 may not include the bias electrode 116.

Both the source RF signal and the bias signal may be continuous waves or pulse waves, and one of the source RF signal and the bias signal may be a continuous wave and the other may be a pulse wave. When both the source RF signal and the bias signal are pulse waves, the periods of both pulse waves may or may not be synchronized with each other. The duty ratios of the pulse waves of the source RF signal and/or the bias signal may be appropriately set, and may be 1 to 80% and may be 5 to 50%, for example. The duty ratio is a ratio occupied by a period in which a power or voltage level is high in the period of the pulse wave. When the bias DC signal is used as the bias signal, the pulse wave may have a waveform of a rectangular shape, a trapezoidal shape, a triangular shape, or a combination thereof. The polarity of the bias DC signal may be negative or positive as long as the potential of the substrate W is set to apply a potential difference between the plasma and the substrate and to attract ions.

Figure 6:
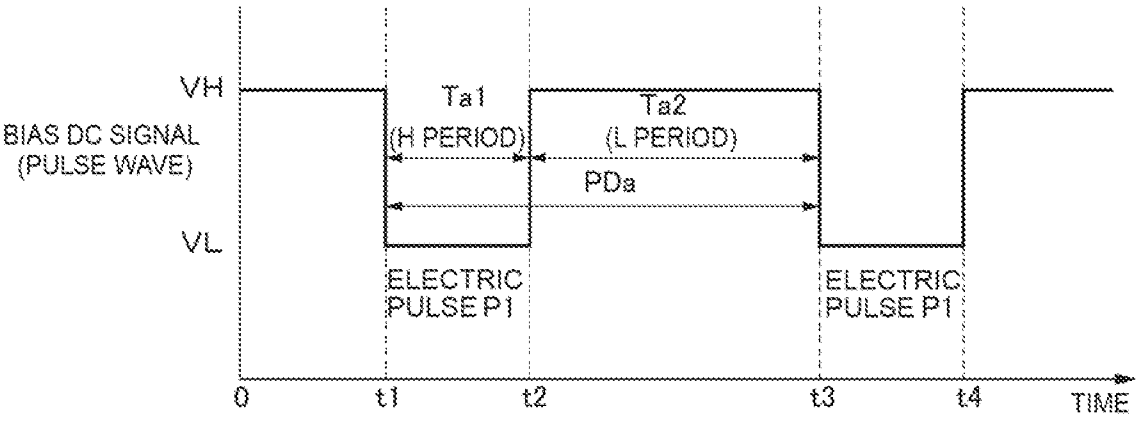
FIG. 6 is a diagram illustrating an example of a bias DC signal.

FIG. 6 is a diagram illustrating an example of the bias DC signal. As illustrated in FIG. 6, as an example, the bias DC signal is a pulse wave in which an H period in which an effective value of the voltage is VL and an L period in which the effective value of the voltage is VH higher than VL are alternately repeated. For example, the bias DC signal includes an electric pulse P1 of which the effective value of the voltage becomes a negative voltage in the H period.

Specifically, the voltage level of the bias DC signal is VL at a time point t1. Thus, the electric pulse P1 is applied to the substrate support 11. The electric pulse P1 is applied to the substrate support 11 during a period (period Ta1) from the time point t1 to a time point t2. When the electric pulse P1 is applied to the substrate support 11 included in the plasma processing apparatus 1, the active species in the plasma are attracted to the substrate W disposed on the substrate support 11. As a result, positive ions collide with the portion of the silicon-containing film SF, which is not covered by the mask MK, and the portion is etched.

At the time point t2, if the voltage level of the bias DC signal becomes VH, the application of the electric pulse is stopped. VH may be 0 V, a positive voltage, or a negative voltage. At a time point t3 when a period Ta2 has elapsed from the time point t2, a period PDa, which is one period of the bias DC signal, is ended. Further, at the time point t3, the voltage level of the bias DC signal becomes VL again, and the next period of the bias DC signal starts.

In Step ST12, supplying and stopping at least one of the source RF signal and the bias signal may be repeated alternately. For example, supplying and stopping the bias signal may be repeated alternately while the source RF signal is continuously supplied. Further, for example, the bias signal may be continuously supplied while the supplying and stopping the source RF signal are repeated alternately. Further, for example, the supplying and stopping both the source RF signal and the bias signal may be alternately repeated.

As described above, in Step ST1, the substrate W including the mask MK and the silicon-containing film SF having the recess RC is prepared on the substrate support 11 in the plasma processing chamber 10. In the above-described example, the recess RC is formed after the substrate W is provided on the substrate support 11. However, the substrate W may be prepared by providing the substrate W on the substrate support 11 of the plasma processing apparatus 1 after the recess RC is formed in the substrate W by an external device or a chamber of the plasma processing apparatus 1.

Step ST2: Forming Carbon-Containing Film on Substrate

A carbon-containing film CF is formed on the substrate W in Step ST2. The carbon-containing film CF may be formed by various methods. As an example, a method using plasma CVD will be described below.

First, a second processing gas including a carbon-containing gas is supplied from the gas supply 20 to the plasma processing space 10*s*. The carbon-containing gas may be, for example, a hydrocarbon gas. In one example, the hydrocarbon gas is at least one gas selected from the group consisting of a $CH_4$ gas, a $C_2H_2$ gas, a $C_2H_4$ gas, and a $C_3H_6$ gas. As the carbon-containing gas, a gas containing fluorine such as a $CH_3F$ gas and a $C_4F_6$ gas may also be used. In this case, conditions under which the deposition is dominant over the etching of the silicon-containing film SF are selected. The second processing gas may further include a nitrogen-containing gas such as an $N_2$ gas or an $NH_3$ gas. The second processing gas may further include a hydrogen-containing gas such as an $H_2$ gas.

Then, the source RF signal is applied to the upper electrode of the shower head 13. An RF electric field is generated between the shower head 13 and the substrate support 11, and a plasma is generated from the second processing gas in the plasma processing space 10*s*. Carbon or active species including carbon, which are generated in the plasma, are attracted to the surface of the substrate W, and thus the carbon-containing film CF is formed on the surface of the substrate W.

In Step ST2, the temperature of the substrate support 11 may be set to a temperature higher than the temperature of the substrate support 11 in Step ST12 or Step ST3. The setting temperature may be, for example, 0° C. or higher.

Further, in Step ST2, a plasma may be generated such that the incidence of ions on the substrate W is suppressed. For example, the source RF signal may be applied only to the upper electrode and may not be applied to the lower electrode. For example, the bias signal does not have to be applied.

Further, in addition to the step of generating the plasma from the second processing gas described above, Step ST2 includes a step of generating a plasma from a processing gas including a nitrogen-containing gas such as an $N_2$ gas or an $NH_3$ gas. Thus, an occurrence of a situation in which carbon in the plasma is excessively deposited on the substrate W and clogging of the opening OP occurs may be suppressed. In Step ST2, the step of generating a plasma from the second processing gas and the step of generating the plasma from the processing gas containing a nitrogen-containing gas may be alternately repeated a plurality of times. The processing gas containing the nitrogen-containing gas may further include a hydrogen-containing gas such as an $H_2$ gas.

Figure 7:
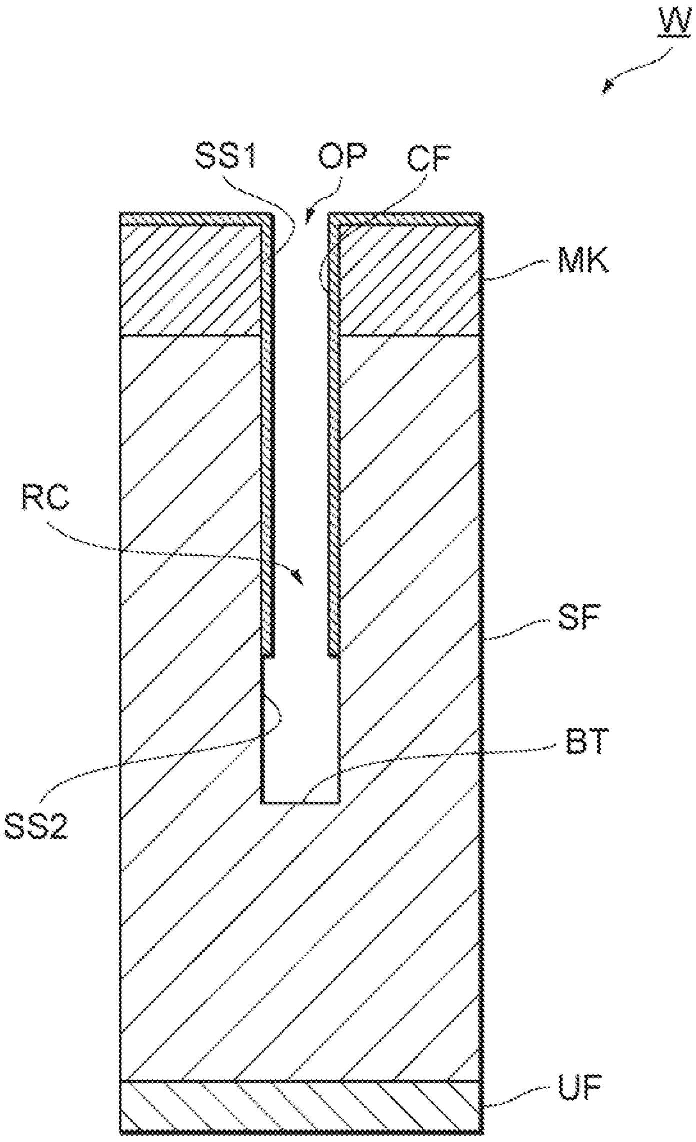
FIG. 7 is a diagram illustrating an example of a cross-sectional structure of the substrate after processing in Step ST2.

FIG. 7 is a diagram illustrating an example of a cross-sectional structure of the substrate W after the processing in Step ST2. As illustrated in FIG. 7, the carbon-containing film CF is formed on the substrate W. The carbon-containing film CF is formed at least a portion of a side wall SS2 of the silicon-containing film SF that defines the recess RC. This portion may be a portion at which the active species (including the one reflected on the side wall SS1 that defines the opening of the mask MK) in the plasma incident on the opening OP has a high collision frequency in the etching in Step ST3. For example, this portion may be a portion corresponding to 10%, 20%, 30%, 40%, 50%, 60%, 70%, 80%, or 90% upward in the depth direction of the side wall SS2 of the silicon-containing film, although the portion depends on the depth of the recess RC. Alternatively, this portion may be more than 0% and 50% or less of a target final depth of the recess RC, that is, a depth from an interface between the mask MK and the silicon-containing film SF to the underlying film UF. As illustrated in FIG. 7, the carbon-containing film CF may be formed from the upper surface and the side wall SS1 of the mask MK over a portion of the side wall SS2 of the silicon-containing film SF. As will be described later, the carbon-containing film CF is combined with tungsten in the plasma to form a protective film PF for etching, in the etching in Step ST3.

The carbon-containing film CF may be formed by ALD or sub-conformal ALD instead of the plasma CVD.

The ALD includes, for example, steps as follows. First, in a first step, a precursor gas including an organic compound is supplied to the substrate W. The organic compound may include, for example, at least one selected from the group consisting of epoxides, carboxylic acids, carboxylic acid halides, carboxylic anhydrides, isocyanates, and phenols. With the first step, the precursor gas is attracted on the surfaces of the mask MK and the silicon-containing film SF. In the first step, a plasma may be generated from the precursor gas.

Then, in a second step, a reaction gas is supplied to the substrate W. The reaction gas is a gas that reacts with the precursor gas attracted on the surface of the substrate W. The reaction gas may include at least one selected from the group consisting of an inorganic compound gas having an NH bond, an inert gas, a mixed gas of an $N_2$ gas and an $H_2$ gas, an $H_2O$ gas, and a mixed gas of an $H_2$ gas and an $O_2$ gas. The inorganic compound gas having an NH bond may be, for example, at least one gas of an $N_2H_2$ gas, and an $N_2H_2$ gas and $NH_3$ gas. With the second step, the precursor gas and the reaction gas react with each other to form the carbon-containing film CF. In the second step, a plasma may be generated from the reaction gas.

An inert gas or the like may be supplied to the substrate W after the first step, before the second step, and/or after the second step. As a result, an excessive precursor gas or reaction gas is purged (purging step). In ALD, the carbon-containing film CF is formed in a manner that a predetermined material is attracted and reacts with a substance existing on the surface of the substrate W in a self-control manner. In the ALD, the conformal carbon-containing film CF is usually formed by providing a sufficient processing time.

Figure 8A:
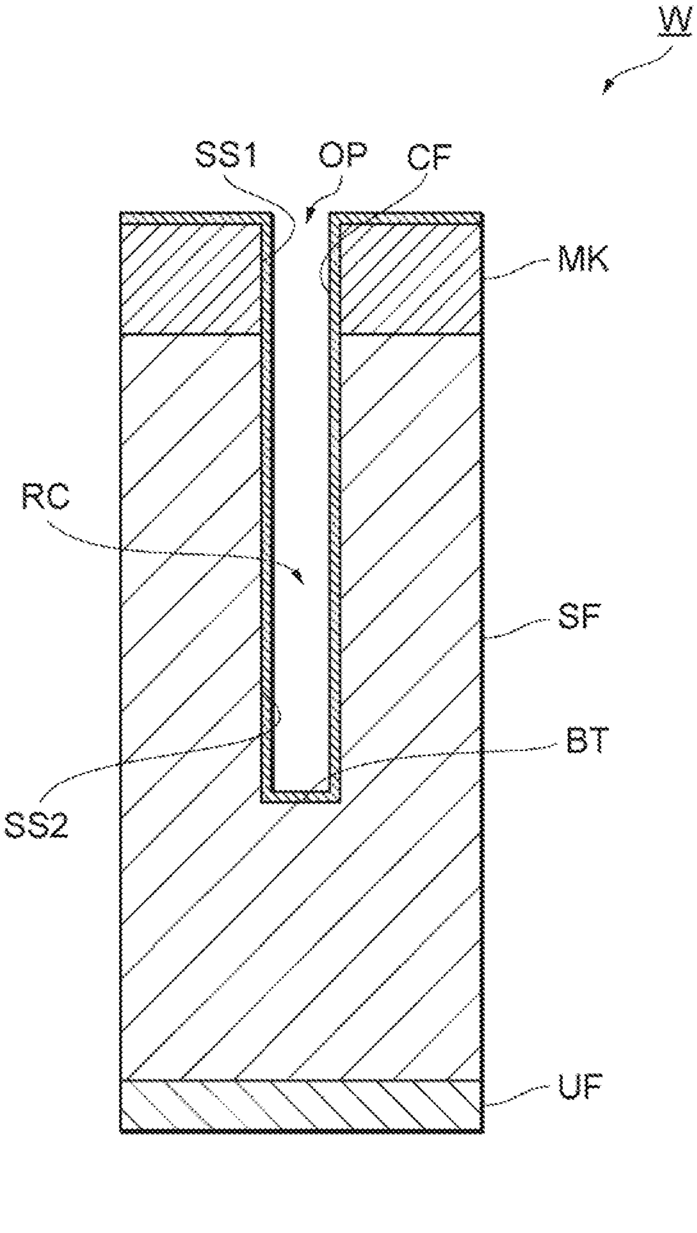
FIG. 8A is a diagram illustrating another example of the cross-sectional structure of the substrate after the processing in Step ST2.

FIG. 8A is a diagram illustrating another example of the cross-sectional structure of the substrate W after the processing in Step ST2. FIG. 8A is an example of a case where the conformal carbon-containing film CF is formed by ALD. As illustrated in FIG. 8A, the carbon-containing film CF is uniformly formed on the upper surface of the mask MK and the side wall SS1 that defines the opening OP, and on the entirety of the side wall SS2 that defines the recess RC of the silicon-containing film SF and a bottom surface BT.

When the conformal carbon-containing film CF is formed in Step ST2, Step ST2 may further include a step (breakthrough step) of removing the carbon-containing film formed on the bottom surface BT of the silicon-containing film SF. The breakthrough step may be executed by, for example, generating a plasma from a processing gas containing an $N_2$ gas and an $H_2$ gas. At this time, the bias signal may be applied to the substrate support 11.

Figure 8B:
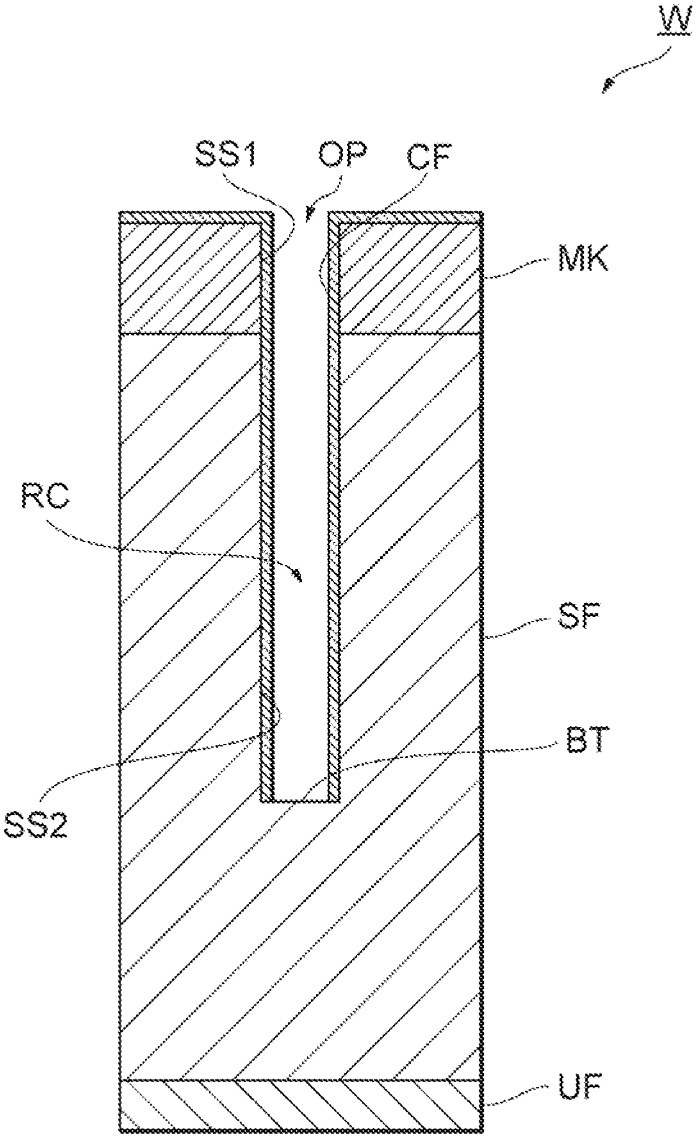
FIG. 8B is a diagram illustrating an example of a cross-sectional structure of the substrate after a breakthrough step.

FIG. 8B is a diagram illustrating an example of the cross-sectional structure of the substrate W after the breakthrough step. As illustrated in FIG. 8B, the carbon-containing film CF formed on the bottom surface BT of the silicon-containing film SF (SF) is removed, and the bottom surface BT, that is, the portion to be etched in Step ST3 is exposed to the recess RC.

The sub-conformal ALD is a method of setting processing conditions such that self-controllable adsorption or reaction is not completed on the surface of the substrate W. The sub-conformal ALD has at least two processing modes as follows.

(i) After the precursor gas is attracted on the entire surface of the substrate W, the reaction gas is controlled not to spread over the entire surface of the precursor gas attracted on the substrate W.

(ii) After the precursor gas is attracted only on a portion of the surface of the substrate W, the reaction gas is caused to react only with the precursor attracted on the surface of the substrate W.

According to the sub-conformal ALD, the carbon-containing film CF having a film thickness that decreases in the depth direction of the recess RC is formed. When the carbon-containing film is also formed on the bottom surface BT of the silicon-containing film SF, the breakthrough step described above may be executed.

In Step ST22, the carbon-containing film CF may be formed by generating a plasma from a processing gas including a gas of a low vapor pressure material, and depositing a fluidized film generated from the low vapor pressure material in the recess RC by this plasma. For example, in one example, the gas of the low vapor pressure material includes at least one gas selected from the group consisting of a $C_3F_6$ gas, a $C_4F_6$ gas, a $C_4F_8$ gas, an isopropyl alcohol (IPA) gas, a $C_3H_2F_4$ gas, and a $C_4H_2F_6$ gas. The gas of the low vapor pressure material may be a gas having vapor pressure at the same temperature as or higher than a temperature indicated by a temperature-vapor pressure curve of $C_4F_8$. In this case, the pressure in the plasma processing space 10*s* may be, for example, 50 mT (6.7 Pa) or higher, and the temperature of the substrate support 11 may be set to 0° C. or lower.

In addition to the above description, the carbon-containing film CF may be formed by various methods such as thermal CVD.

Step ST3: Etching Substrate

The silicon-containing film SF is etched in Step ST3. First, the third processing gas including a fluorine-containing gas and a tungsten-containing gas is supplied from the gas supply 20 to the plasma processing space 10*s*. During the processing in Step ST3, a gas included in the third processing gas and the flow rate (divided pressure) of this gas may or may not be changed. For example, when the silicon-containing film SF is configured by a film stack including different types of silicon-containing films, the configuration of the third processing gas and the flow rate of each gas may be changed with the progress of etching, that is, depending on the type of film to be etched. In Step ST3, the temperature of the substrate support 11 may be appropriately set in accordance with the type of processing gas, the type of silicon-containing film, and the like. For example, when the processing gas includes a fluorine-containing gas, the setting temperature of the substrate support 11 is 0° C. or lower.

Then, the source RF signal is applied to the lower electrode of the substrate support 11 and/or the upper electrode of the shower head 13. As a result, an RF electric field is generated between the shower head 13 and the substrate support 11, and a plasma is generated from the third processing gas in the plasma processing space 10*s*.

In Step ST3, the bias signal may be applied to the lower electrode of the substrate support 11. In this case, a bias potential is generated between the plasma and the substrate W, and active species such as ions and radicals in the plasma are attracted to the substrate W, and etching of the silicon-containing film SF may be promoted. The bias signal may be a bias RF signal supplied from the second RF generator 31*b*. The bias signal may be a bias DC signal supplied from the DC generator 32*a*.

Both the source RF signal and the bias signal may be continuous waves or pulse waves, and one of the source RF signal and the bias signal may be a continuous wave and the other may be a pulse wave. When both the source RF signal and the bias signal are pulse waves, the periods of both pulse waves may or may not be synchronized with each other. The duty ratios of the pulse waves that are the source RF signal and/or the bias signal may be appropriately set, and may be 1 to 80% and may be 5 to 50%, for example. When the bias DC signal is used as the bias signal, the pulse wave may have a waveform of a rectangular shape, a trapezoidal shape, a triangular shape, or a combination thereof. The polarity of the bias DC signal may be negative or positive as long as the potential of the substrate W is set to apply a potential difference between the plasma and the substrate and to attract ions.

In Step ST3, supplying and stopping at least one of the source RF signal and the bias signal may be repeated alternately. For example, supplying and stopping the bias signal may be repeated alternately while the source RF signal is continuously supplied. Further, for example, the bias signal may be continuously supplied while the supplying and stopping the source RF signal are repeated alternately. Further, for example, the supplying and stopping both the source RF signal and the bias signal may be alternately repeated.

The fluorine-containing gas contained in the third processing gas may be, for example, a hydrogen fluoride gas (HF gas) and/or a hydrofluorocarbon gas. The hydrofluorocarbon gas may have the number of carbon atoms that is 2 or more, 3 or more, or 4 or more. In one example, the hydrofluorocarbon gas is at least one selected from the group consisting of a $CH_2F_2$ gas, a $C_3H_2F_4$ gas, a $C_3H_2F_6$ gas, a $C_3H_3F_5$ gas, a $C_4H_2F_6$ gas, a $C_4H_5F_5$ gas, a $C_4H_2F_8$ gas, a $C_5H_2F_6$ gas, a $C_5H_2F_{10}$ gas, and a $C_5H_3F_7$ gas. In one example, the hydrofluorocarbon gas is at least one selected from the group consisting of a $CH_2F_2$ gas, a $C_3H_2F_4$ gas, a $C_3H_2F_6$ gas, and a $C_4H_2F_6$ gas.

The fluorine-containing gas may be, for example, a mixed gas containing a hydrogen source and a fluorine source. The hydrogen source may be, for example, at least one selected from the group consisting of an $H_2$ gas, an $NH_3$ gas, a $H_2O$ gas, a $H_2O_2$ gas, and a hydrocarbon gas ($CH_4$ gas, $C_3H_6$ gas, and the like). The fluorine source may be, for example, a fluorine-containing gas that does not contain carbon, such as an $NF_3$ gas, an $SF_6$ gas, an $WF_6$ gas, or a $XeF_2$ gas. In addition, the fluorine source may be a fluorine-containing gas containing carbon, such as a fluorocarbon gas and a hydrofluorocarbon gas. In one example, the fluorocarbon gas may be at least one selected from the group consisting of a $CF_4$ gas, a $C_2F_2$ gas, a $C_2F_4$ gas, a $C_3F_6$ gas, a $C_3F_8$ gas, a $C_4F_6$ gas, a $C_4F_8$ gas, and a $C_5F_8$ gas. In one example, the hydrofluorocarbon gas may be at least one selected from the group consisting of a $CHF_3$ gas, a $CH_2F_2$ gas, a $CH_3F$ gas, a $C_2HF_5$ gas, and a hydrofluorocarbon gas containing 3 or more C ($C_3H_2F_4$ gas, $C_3H_2F_6$ gas, $C_4H_2F_6$ gas, and the like).

When the fluorine-containing gas is an HF gas, the HF gas may have the largest flow rate (divided pressure) in the third processing gas (all gases excluding an inert gas when the third processing gas includes the inert gas). In one example, the flow rate of the HF gas may be 50 vol % or more, 60 vol % or more, 70 vol % or more, 80 vol % or more, 90 vol % or more, or 95 vol % or more with respect to the total flow rate of the third processing gas (flow rate of all gases excluding an inert gas when the third processing gas includes the inert gas). The flow rate of the HF gas may be less than 100 vol %, 99.5 vol % or less, 98 vol % or less, or 96 vol % or less with respect to the total flow rate of the third processing gas. In one example, the flow rate of the HF gas is adjusted to be 70 vol % or more and 96 vol % or less with respect to the total flow rate of the third processing gas.

The tungsten-containing gas included in the third processing gas may be, for example, a gas containing tungsten and halogen. In one example, the tungsten-containing gas is a $WF_xCl_y$ gas (x and y are each integers of 0 or more and 6 or less, and the sum of x and y is 2 or more and 6 or less). Specifically, the tungsten-containing gas may include a gas containing tungsten and fluorine, such as a tungsten difluoride ($WF_2$) gas, a tungsten tetrafluoride ($WF_4$) gas, a tungsten pentafluoride ($WF_5$) gas, and a tungsten hexafluoride ($WF_6$) gas; and a gas containing tungsten and chlorine, such as a tungsten dichloride ($WCl_2$) gas, a tungsten tetrachloride ($WCl_4$) gas, a tungsten pentachloride ($WCl_5$) gas, and a tungsten hexachloride ($WCl_6$) gas. Among the above gases, at least one of a $WF_6$ gas and a $WCl_6$ gas may be used. The flow rate of the tungsten-containing gas may be 0.1 vol % or more and 5 vol % or less of the total flow rate of the third processing gas. The third processing gas may include at least one of a titanium-containing gas, a molybdenum-containing gas, and a ruthenium-containing gas instead of or in addition to the tungsten-containing gas.

The third processing gas may further include a phosphorus-containing gas. The phosphorus-containing gas is a gas containing phosphorus-containing molecules. The phosphorus-containing molecules may be oxides such as tetraphosphorus decaoxides ($P_4O_{10}$), tetraphosphorus octaoxides ($P_4O_8$), tetraphosphorus hexaoxides ($P_4O_6$), and the like. Tetraphosphorus decaoxides may be referred to as diphosphorus pentoxides ($P_2O_5$). The phosphorus-containing molecules may be halides (phosphorus halides) such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), and phosphorus iodide ($PI_3$). That is, the phosphorus-containing molecule may contain fluorine as a halogen element such as phosphorus fluoride. Alternatively, the phosphorus-containing molecule may contain a halogen element other than fluorine, as the halogen element. The phosphorus-containing molecule may be a phosphoryl halide such as phosphoryl fluoride ($POF_3$), phosphoryl chloride ($POCl_3$), and phosphoryl bromide ($POBr_3$). The phosphorus-containing molecule may be phosphine ($PH_3$), calcium phosphide ($Ca_3P_2$ and the like), phosphoric acid ($H_3PO_4$), sodium phosphate ($Na_3PO_4$), and hexafluorophosphoric acid ($HPF_6$). The phosphorus-containing molecule may be fluorophosphins ($H_gPF_h$). Here, the sum of g and h is 3 or 5. Examples of fluorophosphins include $HPF_2$ and $H_2PF_3$. The processing gas may contain one or more phosphorus-containing molecules among the above-described phosphorus-containing molecules, as at least one phosphorus-containing molecule. For example, the second processing gas may contain at least one of $PF_3$, $PCl_3$, $PF_5$, $PCl_5$, $POCl_3$, $PH_3$, $PBr_3$, and $PBr_5$, as at least one phosphorus-containing molecule. When each phosphorus-containing molecule contained in the third processing gas is a liquid or a solid, each phosphorus-containing molecule may be vaporized by heating or the like and supplied into the plasma processing space 10*s*.

The phosphorus-containing gas may be a $PCl_aF_b$ (a is an integer of 1 or more, b is an integer of 0 or more, a+b is an integer of 5 or less) gas or a $PC_cH_dF_e$ (d and e are each an integer of 1 or more and 5 or less, and c is an integer of 0 or more and 9 or less) gas.

The $PCl_aF_b$ gas may be, for example, at least one gas selected from the group consisting of a $PClF_2$ gas, a $PCl_2F$ gas, and a $PCl_2F_3$ gas.

The $PC_cH_dF_e$ gas may be, for example, at least one gas selected from the group consisting of a $PF_2CH_3$ gas, a $PF(CH_3)_2$ gas, a $PH_2CF_3$ gas, a $PH(CF_3)_2$ gas, a $PCH_3(CF_3)_2$ gas, a $PH_2F$ gas, and a $PF_3(CH_3)_2$ gas.

The phosphorus-containing gas may be a $PCl_bF_dC_eH_f$ (c, d, e, and f are each an integer of 1 or more) gas. The phosphorus-containing gas may be a gas in which P (phosphorus), F (fluorine), and halogen (for example, Cl, Br, or I) other than F (fluorine) are included in the molecular structure, a gas in which P (phosphorus), F (fluorine), C (carbon), and H (hydrogen) are included in the molecular structure, or a gas in which P (phosphorus), F (fluorine), and H (hydrogen) are included in the molecular structure.

A phosphine-based gas may be used as the phosphorus-containing gas. Examples of the phosphine-based gas include phosphine ($PH_3$), a compound in which at least one hydrogen atom of phosphine is replaced with an appropriate substituent, and phosphinic acid derivatives.

The substituent for replacing the hydrogen atom of phosphine is not particularly limited. Examples of the substituent include halogen atoms such as fluorine atoms and chlorine atoms; alkyl groups such as methyl groups, ethyl groups, and propyl groups; and hydroxyalkyl groups such as hydroxymethyl groups, hydroxyethyl groups, and hydroxypropyl groups. In one example, chlorine atoms, methyl groups, and hydroxymethyl groups are exemplified.

Examples of the phosphinic acid derivatives include phosphinic acid ($H_3O_2P$), alkylphosphinic acid (PHO(OH)R), and dialkylphosphinic acid ($PO(OH)R_2$).

As the phosphine-based gas, for example, at least one gas selected from the group consisting of a $PCH_3Cl_2$ (dichloro(methyl)phosphine) gas, a $P(CH_3)_2Cl$ (chloro(dimethyl)phosphine) gas, a $P(HOCH_2)Cl_2$ (dichloro(hydroxylmethyl)phosphine) gas, a $P(HOCH_2)_2Cl$ (chloro(dihydroxymethyl)phosphine) gas, a $P(HOCH_2)(CH_3)_2$ (dimethyl(hydroxylmethyl)phosphine) gas, a $P(HOCH_2)_2(CH_3)$ (methyl(dihydroxylmethyl)phosphine) gas, a $P(HOCH_2)_3$ (tris(hydroxylmethyl)phosphine) gas, an $H_3O_2P$ (phosphinic acid) gas, a $PHO(OH)(CH_3)$ (methylphosphinic acid) gas, and a $PO(OH)(CH_3)_2$ (dimethylphosphinic acid) gas.

The flow rate of the phosphorus-containing gas may be 20 vol % or less, 10 vol % or less, or 5 vol % or less of the total flow rate of the third processing gas. The flow rate of the phosphorus-containing gas may be 1 vol % or more of the total flow rate of the third processing gas.

The third processing gas may further include a carbon-containing gas. The carbon-containing gas may be, for example, either or both of a fluorocarbon gas and a hydrofluorocarbon gas. In one example, the fluorocarbon gas may be at least one selected from the group consisting of a $CF_4$ gas, a $C_2F_2$ gas, a $C_2F_4$ gas, a $C_3F_6$ gas, a $C_3F_8$ gas, a $C_4F_6$ gas, a $C_4F_8$ gas, and a $C_5F_8$ gas. In one example, the hydrofluorocarbon gas may be at least one selected from the group consisting of a $CHF_3$ gas, a $CH_2F_2$ gas, a $CH_3F$ gas, a $C_2HF_5$ gas, a $C_2H_2F_4$ gas, a $C_2H_3F_3$ gas, a $C_2H_4F_2$ gas, a $C_3HF_7$ gas, a $C_3H_2F_2$ gas, a $C_3H_2F_4$ gas, a $C_3H_2F_6$ gas, a $C_3H_3F_5$ gas, a $C_4H_2F_6$ gas, a $C_4H_5F_5$ gas, a $C_4H_2F_8$ gas, a $C_5H_2F_6$ gas, a $C_5H_2F_{10}$ gas, and a $C_5H_3F_7$ gas. In addition, the carbon-containing gas may be a linear one having an unsaturated bond. The linear carbon-containing gas having an unsaturated bond may be, for example, at least one selected from the group consisting of a $C_3F_6$ (hexafluoropropene) gas, a $C_4F_8$ (octafluoro-1-butene, octafluoro-2-butene) gas, a $C_3H_2F_4$ (1,3,3,3-tetrafluoropropene) gas, a $C_4H_2F_6$ (trans-1,1,1,4,4,4-hexafluoro-2-butene) gas, a $C_4F_8O$ (pentafluoroethyl trifluorovinyl ether) gas, a $CF_3COF$ gas (1,2,2,2-tetrafluoroethan-1-one), a $CHF_2COF$ (difluoroacetic acid fluoride) gas, and a $COF_2$ (carbonyl fluoride) gas.

The third processing gas may further include an oxygen-containing gas. The oxygen-containing gas may be, for example, at least one gas selected from the group consisting of $O_2$, CO, $CO_2$, $H_2O$, and $H_2O_2$. In one example, the oxygen-containing gas may be an oxygen-containing gas other than $H_2O$, for example, at least one gas selected from the group consisting of $O_2$, CO, $CO_2$, and $H_2O_2$. The flow rate of the oxygen-containing gas may be adjusted in accordance with the flow rate of the carbon-containing gas.

The third processing gas may further include a halogen-containing gas other than fluorine. The halogen-containing gas other than fluorine may be a chlorine-containing gas, a bromine-containing gas, and/or an iodine-containing gas. In one example, the chlorine-containing gas may be at least one gas selected from the group consisting of $Cl_2$, $SiCl_2$, $SiCl_4$, $CCl_4$, $SiH_2Cl_2$, $Si_2Cl_6$, $CHCl_3$, $SO_2Cl_2$, $BCl_3$, $PCl_3$, $PCl_5$, and $POCl_3$. In one example, the bromine-containing gas may be at least one gas selected from the group consisting of $Br_2$, HBr, $CBr_2F_2$, $C_2F_5Br$, $PBr_3$, $PBr_5$, $POBr_3$, and $BBr_3$. In one example, the iodine-containing gas may be at least one gas selected from the group consisting of HI, $CF_3I$, $C_2F_5I$, $C_3F_7I$, $IF_5$, $IF_7$, $I_2$, and $PI_3$. In one example, the halogen-containing gas other than fluorine may be at least one selected from the group consisting of a $Cl_2$ gas, a $Br_2$ gas, and an HBr gas. In one example, the halogen-containing gas other than fluorine is a $Cl_2$ gas or an HBr gas.

The third processing gas may further include an inert gas. In one example, the inert gas may be a noble gas such as an Ar gas, a He gas, or a Kr gas, or a nitrogen gas.

Figure 9:
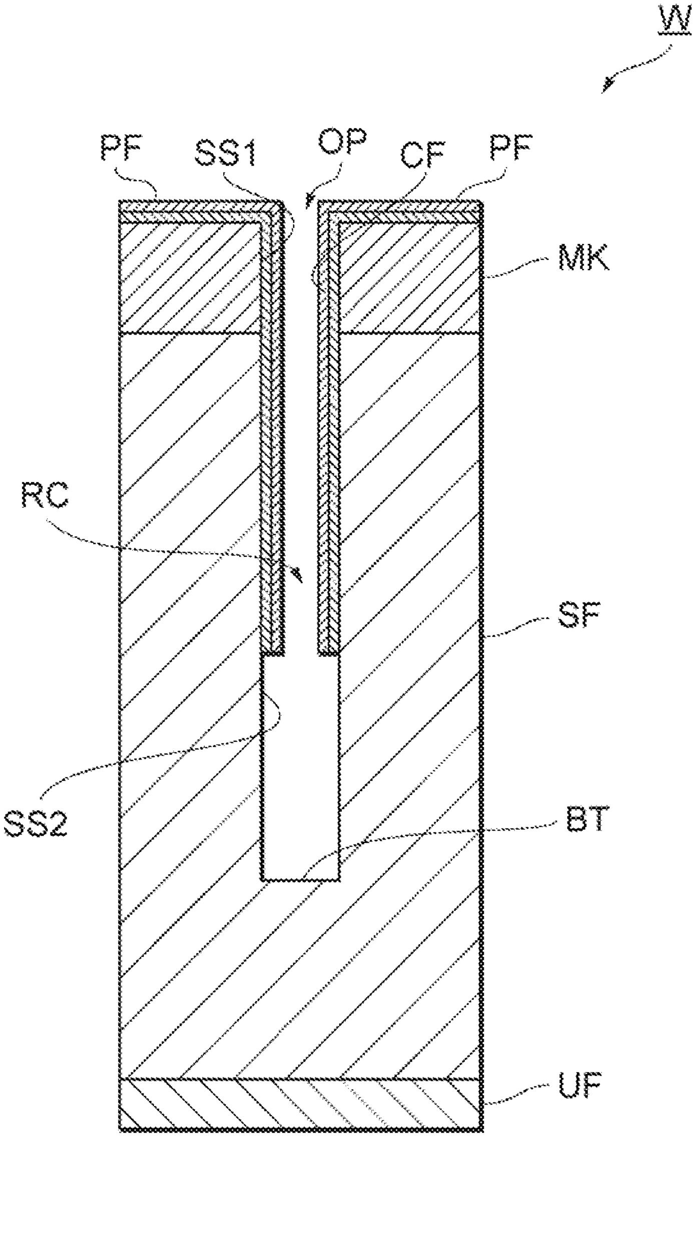
FIG. 9 is a diagram illustrating an example of a cross-sectional structure of the substrate during processing in Step ST3.

FIG. 9 is a diagram illustrating an example of a cross-sectional structure of the substrate W during processing in Step ST3. As illustrated in FIG. 9, the portion (portion exposed in the opening OP) of the silicon-containing film SF, which is not covered by the mask MK, is etched in the depth direction by active species of fluorine in the plasma. In addition, tungsten in the plasma is selectively deposited on the carbon-containing film CF, and thus the protective film PF containing tungsten is formed. It is considered that this is because tungsten is less likely to be deposited on the surface of the silicon-containing film SF, but tungsten tends to be easily deposited on the surface of the carbon-containing film CF. The protective film PF may be formed on the entire surface of the carbon-containing film CF, or may be formed on a portion of the carbon-containing film CF. The protective film PF may be preferentially formed on the carbon-containing film CF on the side wall SS2 of the silicon-containing film SF. Tungsten in the protective film PF has a low reactivity with fluorine species in the plasma, and the etching resistance against the plasma is higher than that of the silicon-containing film SF. Therefore, the removal of the side wall SS2 of the silicon-containing film SF by etching during the processing of Step ST3 is suppressed.

As described above, in the present processing method, in Step ST3, it is possible to suppress the etching of the side wall SS2 of the silicon-containing film SF in the lateral direction while etching the silicon-containing film SF in the depth direction. Thus, in the present processing method, it is possible to suppress the occurrence of shape abnormality due to etching such as bowing.

Figure 10:
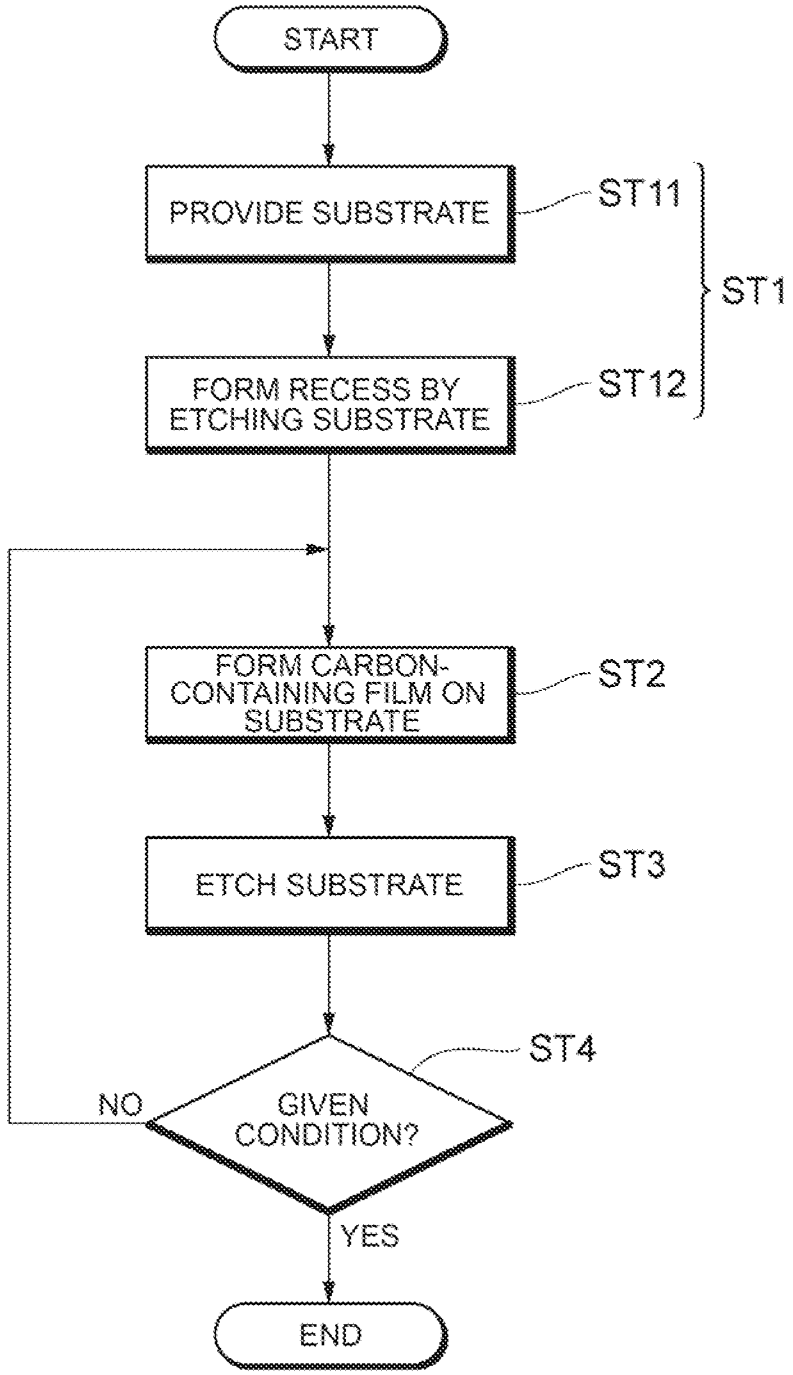
FIG. 10 is a flowchart illustrating another example of the present processing method.

FIG. 10 is a flowchart illustrating another example of the present processing method. As illustrated in FIG. 10, in the present example, after Step ST3, it is determined whether or not a given condition is satisfied, and Step ST2 and Step ST3 are repeated until it is determined that the given condition is satisfied. Except for this point, the present example is similar to the flowchart illustrated in FIG. 2.

The given condition in Step ST4 may be appropriately determined. For example, the given condition may be a condition regarding the number of cycles when Step ST2 and Step ST3 are set to one cycle. That is, it may be determined whether or not the number of cycles has reached the number of repetitions (for example, 10, 20, 30, 50, or the like) set in advance, and Step ST2 and Step ST3 may be repeated until the number of cycles reaches the number of repetitions. The number of repetitions may be set based on the film thickness (depth to be etched) of the silicon-containing film SF.

For example, the given condition may be a condition regarding the dimensions of the recess RC after the processing in Step ST3. That is, after Step ST3, it may be determined whether or not the depth of the recess RC or the width of the bottom surface BT has reached a given value or range, and the cycle of Step ST2 and Step ST3 may be repeated until the depth of the recess RC or the width of the bottom surface BT reaches the given value or range. The dimensions of the recess RC may be measured by an optical measuring device. When a plurality of substrates W is processed as one unit (referred to as a "lot" below) in the present processing method, repetition of the cycle may be determined based on the dimensions of the recess RC after processing, only for one or a plurality of substrates W included in the lot. The number of cycles repeated at this time may be stored and used as the given condition for other substrates included in the lot. That is, for the other substrates, it may be determined whether the number of stored cycles has been reached. When the number of cycles has not been reached, Step ST2 and Step ST3 may be repeated.

Figure 11:
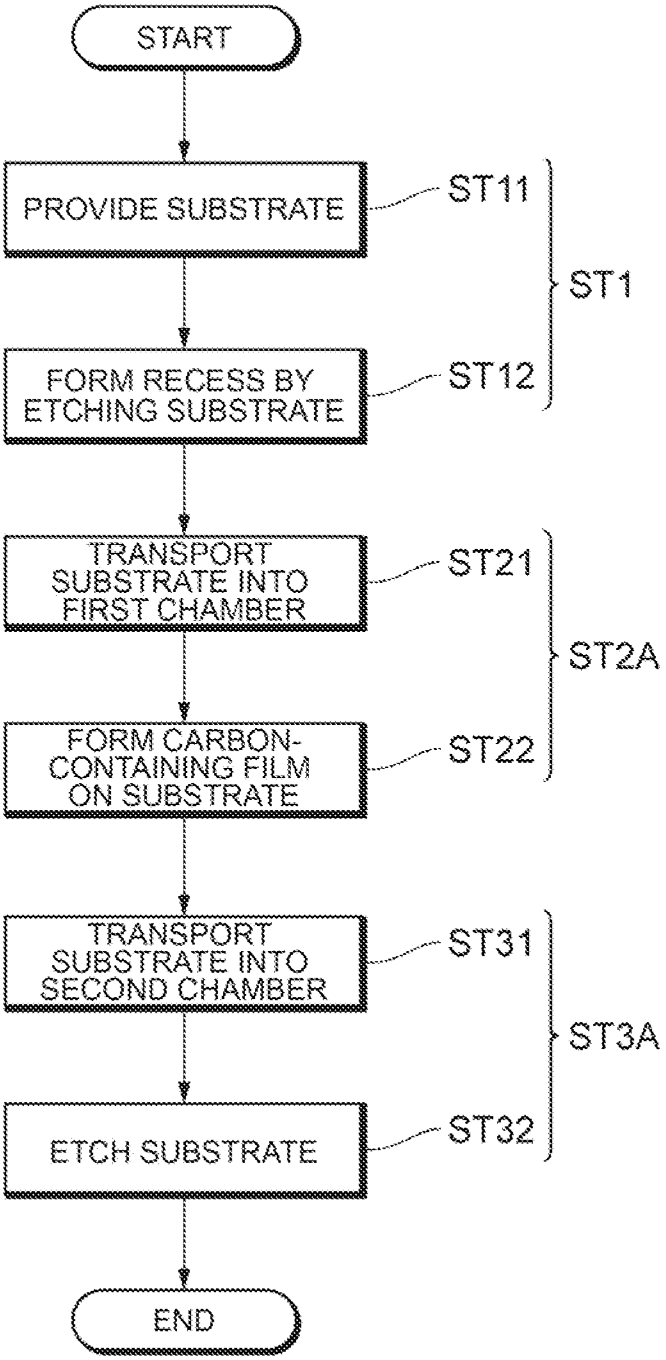
FIG. 11 is a flowchart illustrating still another example of the present processing method.

FIG. 11 is a flowchart illustrating still another example of the present processing method. As illustrated in FIG. 11, in the present example, Step ST1 of preparing the substrate having the recess, Step ST2A of forming a carbon-containing film on a substrate in a first chamber, and Step ST3A of etching the substrate in a second chamber are provided. Since the processing in Step ST1 is similar to Step ST1 in FIG. 2, the description thereof will be omitted.

Step ST2A includes Step ST21 of transporting the substrate W to the first chamber and Step ST22 of forming a carbon-containing film in the first chamber. The first chamber is a chamber different from the chamber used in Step ST1. In Step ST21, the substrate W may be transported via a transport device having a transport chamber W. The pressure inside the transport chamber may be lower than the pressure outside the transport chamber. The inside of the transport chamber may be maintained in a decompressed atmosphere that is the same as or similar to that of the chamber used in Step ST1 and/or the first chamber. The first chamber may be combined to an inductively-coupled plasma generator. That is, the formation of the carbon-containing film CF by Step ST22 may be performed in a manner that the inductively-coupled plasma generator generates a plasma. Since the processing in Step ST22 is similar to Step ST2 described with reference to FIG. 2, the description thereof will be omitted.

Step ST3A includes Step ST31 of transporting the substrate W to the second chamber and Step ST32 of etching the substrate W in the second chamber. The second chamber is different from the first chamber. The second chamber may be the same as or different from the chamber used in Step ST1. In Step ST31, the substrate W may be transported via the transport device including the transport chamber in the similar manner to Step ST21. The pressure inside the transport chamber may be lower than the pressure outside the transport chamber. The inside of the transport chamber may be maintained in a decompressed atmosphere that is the same as or similar to that of the first chamber and/or the second chamber. The second chamber may be combined to a capacitively-coupled plasma generator. That is, the etching by Step ST32 may be performed in a manner that the inductively-coupled plasma generator generates a plasma. Since the processing in Step ST32 is similar to Step ST3 described with reference to FIG. 2, the description thereof will be omitted.

Figure 12:
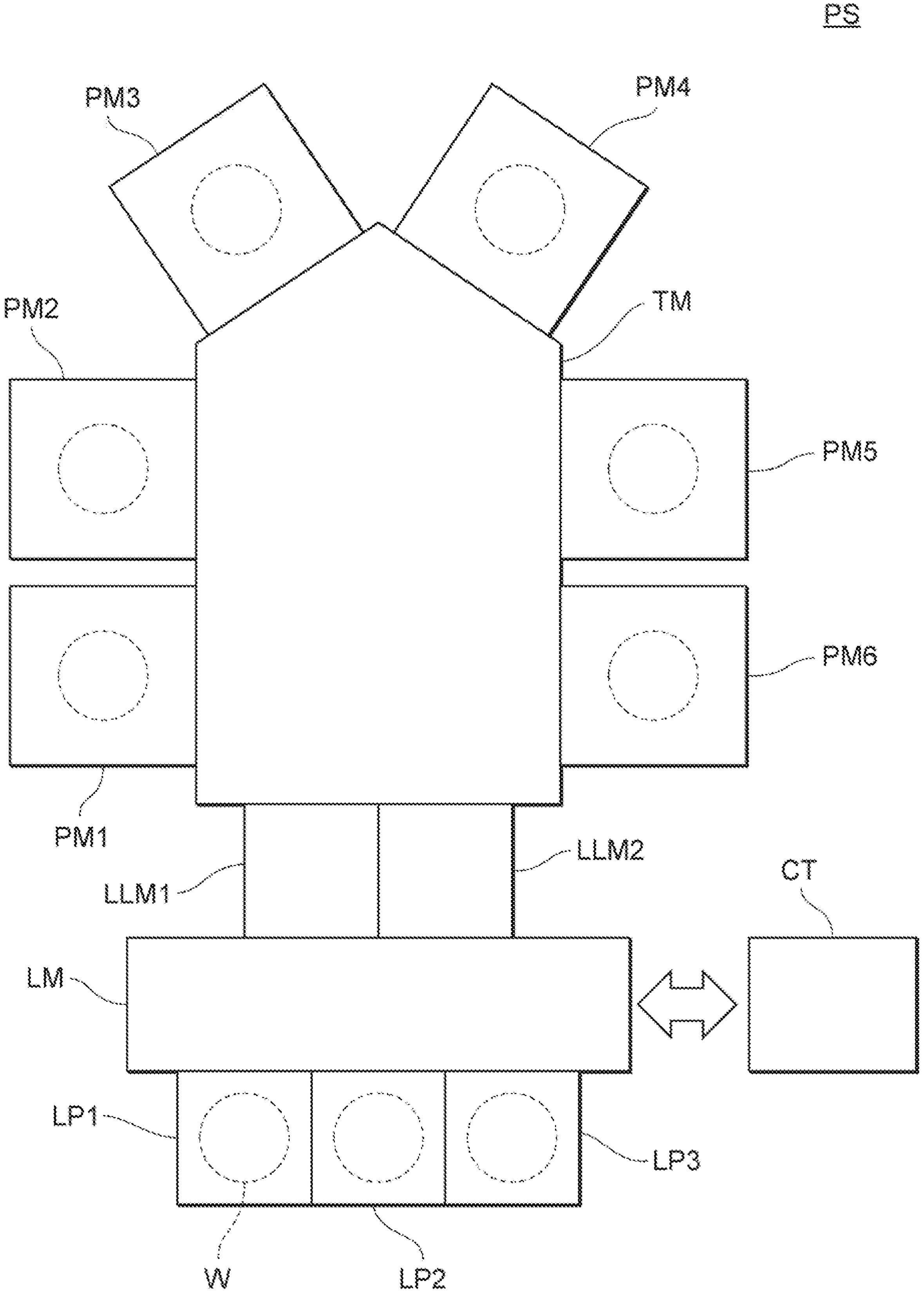
FIG. 12 is a diagram schematically illustrating another example of the plasma processing system.

FIG. 12 is a diagram schematically illustrating another example of the plasma processing system (referred to as a "substrate processing system PS" below). The example illustrated in FIG. 11 may be performed by using the substrate processing system PS.

The substrate processing system PS includes substrate processing chambers PM1 to PM6 (hereinafter also collectively referred to as the substrate processing modules PM), a transfer module TM, loadlock modules LLM1 and LLM2 (hereinafter also collectively referred to as the loadlock modules LLM), a loader module LM, and load ports LP1 to LP3 (hereinafter also collectively referred to as the load ports LP). A controller CT controls the components of the substrate processing system PS to perform predetermined processing on a substrate W.

A portion of the substrate processing module M may be a capacitively-coupled plasma processing apparatus as illustrated in FIG. 1. That is, at least one of the substrate processing chambers PM1 to PM6 may be coupled to the capacitively-coupled plasma generator. A part of the substrate processing module PM may be an inductively-coupled plasma processing apparatus. That is, at least one of the substrate processing chambers PM1 to PM6 may be combined to the inductively-coupled plasma generator. The substrate processing modules PM may include a measurement module that may measure, for example, the thickness of a film formed on the substrate W and the dimensions of a pattern formed on the substrate W.

The transfer module TM includes a transfer device that transfers the substrate W between the substrate processing modules PM or between a substrate processing module PM and a loadlock module LLM. The substrate processing modules PM and the loadlock modules LLM are located adjacent to the transfer module TM. The transfer module TM, the substrate processing modules PM, and the loadlock modules LLM are spatially isolated or connected through gate valves that can be open and closed.

The loadlock modules LLM1 and LLM2 are located between the transfer module TM and the loader module LM. Each loadlock module LLM can switch its internal pressure between an ambient atmosphere and a vacuum atmosphere. "The atmospheric pressure" may be pressure outside each module included in the substrate processing system PS. In addition, the "vacuum" may be pressure lower than the atmospheric pressure, and may be, for example, a medium vacuum of 0.1 Pa to 100 Pa. The loadlock module LLM transfers the substrate W from the loader module LM, which is in the ambient atmosphere, to the transfer module TM, which is in the vacuum atmosphere, or from the transfer module TM, which is in the vacuum atmosphere, to the loader module LM, which is in the ambient atmosphere.

The loader module LM includes a transfer device that transfers the substrate W between the loadlock module LLM and a load port LP. The load port LP can receive, for example, a front-opening unified pod (FOUP) that can store 25 substrates W or an empty FOUP. The loader module LM unloads a substrate W from the FOUP in the load port LP and transfers the substrate W to the loadlock module LLM. The loader module LM unloads a substrate W from the loadlock module LLM and transfers the substrate W to the FOUP in the load port LP.

The controller CT controls the components of the substrate processing system PS to perform predetermined processing on the substrate W. The controller CT stores recipes containing process procedures, process conditions, transfer conditions, or other sets of data. The controller CT controls the components of the substrate processing system PS to perform predetermined processing on a substrate W in accordance with the recipes. The controller CT may implement a part or all of the functions of the controller 2 shown in FIG. 1.

EXAMPLES

Next, examples of the present processing method will be described. The present disclosure is not limited in any way by the following examples.

Example 1

The present processing method is performed in accordance with the flowchart illustrated in FIG. 9 by using a substrate W similar to the substrate W illustrated in FIG. 3. A mask MK of the substrate W is an amorphous carbon film, and the opening dimension is 80 nm. The silicon-containing film SF is a film stack of a silicon oxide film and a silicon nitride film.

In Step ST12, a recess RC is formed in the substrate W by using a capacitively-coupled plasma processing apparatus W. The first processing gas includes a halogen-containing gas, a phosphorus-containing gas, and a hydrofluorocarbon gas. The temperature of the substrate support is set to −70° C. In Step ST22, a carbon-containing film CF is formed by plasma CVD using an inductively-coupled plasma processing apparatus. Specifically, a step of generating a plasma from a processing gas containing an $N_2$ gas and an $H_2$ gas and a step of generating a plasma from a second processing gas including a hydrocarbon gas, an $N_2$ gas, and an $H_2$ gas are repeated a plurality of cycles. In Step ST32, the substrate W is etched by using the same capacitively-coupled plasma processing apparatus as in Step ST12. The third processing gas includes a halogen-containing gas, a tungsten-containing gas, a phosphorus-containing gas, a fluorocarbon gas, and a hydrofluorocarbon gas.

Reference Example 1

In Reference Example 1, a substrate W is etched by continuously executing Step ST3A from Step ST1 without executing Step ST2A. The other points are similar to those in Example 1.

As a result of performing a TEM-EDX analysis after the end of Step ST32, it is observed that, for the substrate W according to Example 1, tungsten adheres to the side wall SS2 of the silicon-containing film SF. On the other hand, in the substrate W according to Reference Example 1, no tungsten is observed on the side wall SS2 of the silicon-containing film SF. Further, in Example 1, an opening dimension at the side wall SS2 of the silicon-containing film SF to which tungsten adheres is maintained to about 80 nm, and bowing did not occur. On the other hand, in Reference Example 1, the opening dimension is significantly increased (opening dimension of 126 nm) at a portion of the side wall SS2 of the silicon-containing film SF, and bowing has occurred.

According to one exemplary embodiment of the present disclosure, it is possible to provide a technique for suppressing the shape abnormality in etching.

The embodiments of the present disclosure further include the following aspects.

Addendum 1

An etching method including:

(a) preparing a substrate, the substrate comprising a silicon-containing film and a mask, the silicon-containing film including a recess, the mask being provided on the silicon-containing film and including an opening that exposes the recess;

(b) forming a carbon-containing film on a side wall of the silicon-containing film, the side wall defining the recess; and (c) by using a plasma generated from a processing gas, forming a protective film containing tungsten on the carbon-containing film and etching the silicon-containing film in the recess, the processing gas including a fluorine-containing gas and a tungsten-containing gas.

Addendum 2

The etching method according to Addendum 1, in which, in (b), the carbon-containing film is formed from the side wall of the mask that defines the opening to at least a portion of the side wall of the silicon-containing film.

Addendum 3

The etching method according to Addendum 2, in which, in (b), the carbon-containing film is not formed on a bottom surface of the silicon-containing film that defines the recess.

Addendum 4

The etching method according to Addendum 2, in which, in (b), the carbon-containing film is also formed on a bottom surface of the silicon-containing film that defines the recess.

Addendum 5

The etching method according to any one of Addenda 1 to 4, in which, in (b), the protective film is preferentially formed on the carbon-containing film on the side wall of the silicon-containing film.

Addendum 6

The etching method according to any one of Addenda 1 to 5, in which a cycle including (b) and (c) is repeated a plurality of times.

Addendum 7

The etching method according to any one of Addenda 1 to 6, in which (b) is executed in a first chamber, and (c) is executed in a second chamber different from the first chamber.

Addendum 8

The etching method according to Addendum 7, further including: after (b), transporting the substrate from the first chamber to the second chamber via a transport chamber, in which pressure inside the transport chamber is lower than pressure outside the transport chamber.

Addendum 9

The etching method according to Addendum 7 or 8, in which (a) includes forming the recess in the silicon-containing film in the second chamber by etching using a plasma generated from a processing gas including a fluorine-containing gas.

Addendum 10

The etching method according to any one of Addenda 7 to 9, in which a temperature of a substrate support in the first chamber that supports the substrate in (b) is higher than a temperature of the substrate support in the second chamber that supports the substrate in (c).

Addendum 11

The etching method according to any one of Addenda 1 to 10, in which (b) includes generating a plasma from a processing gas including a nitrogen-containing gas and generating a plasma from a processing gas containing a carbon-containing gas.

Addendum 12

The etching method according to Addendum 11, in which the carbon-containing gas is a hydrocarbon gas.

Addendum 13

The etching method according to any one of Addenda 7 to 10, in which (b) is executed by generating an inductively-coupled plasma, and (c) is executed by generating a capacitively-coupled plasma.

Addendum 14

The etching method according to any one of Addenda 1 to 13, in which, in (c), the fluorine-containing gas includes at least one of a hydrogen fluoride gas and a hydrofluorocarbon gas.

Addendum 15

The etching method according to any one of Addenda 1 to 14, in which, in (c), the processing gas further includes a phosphorus-containing gas.

Addendum 16

The etching method according to any one of Addenda 1 to 15, in which, in (c), the processing gas further includes a carbon-containing gas.

Addendum 17

The etching method according to any one of Addenda 1 to 16, in which, in (c), a temperature of a substrate support that supports the substrate is 0° C. or lower.

Addendum 18

The etching method according to any one of Addenda 1 to 17, in which the silicon-containing film is a silicon oxide film, a silicon nitride film, a polycrystalline silicon film, or a film stack containing two or more of the silicon oxide film, the silicon nitride film, and the polycrystalline silicon film.

Addendum 19

The etching method according to any one of Addenda 1 to 18, in which the mask is either a carbon-containing film or a metal-containing film.

Addendum 20

A plasma processing system comprising:

a plasma processing apparatus including a chamber; and a controller configured to cause (a) preparing a substrate, the substrate comprising a silicon-containing film and a mask, the silicon-containing film including a recess, the mask being provided on the silicon-containing film and including an opening that exposes the recess, (b) forming a carbon-containing film on a side wall of the silicon-containing film, the side wall defining the recess, and (c) by using a plasma generated from a processing gas, forming a protective film containing tungsten on the carbon-containing film and etching the silicon-containing film in the recess, the processing gas including a fluorine-containing gas and a tungsten-containing gas.

Addendum 21

A device manufacturing method executed in a plasma processing apparatus comprising a chamber, the device manufacturing method including:

(a) preparing a substrate, the substrate comprising a silicon-containing film and a mask, the silicon-containing film including a recess, the mask being provided on the silicon-containing film and including an opening that exposes the recess;

(b) forming a carbon-containing film on a side wall of the silicon-containing film, the side wall defining the recess; and (c) by using a plasma generated from a processing gas, forming a protective film containing tungsten on the carbon-containing film and etching the silicon-containing film in the recess, the processing gas including a fluorine-containing gas and a tungsten-containing gas.

Addendum 22

A program configured to cause a computer of a plasma processing system comprising a plasma processing apparatus with a chamber and a controller to perform etching including:

(a) preparing a substrate, the substrate comprising a silicon-containing film and a mask, the silicon-containing film including a recess, the mask being provided on the silicon-containing film and including an opening that exposes the recess;

(b) forming a carbon-containing film on a side wall of the silicon-containing film, the side wall defining the recess; and (c) by using a plasma generated from a processing gas, forming a protective film containing tungsten on the carbon-containing film and etching the silicon-containing film in the recess, the processing gas including a fluorine-containing gas and a tungsten-containing gas.

Addendum 23

A storage medium in which the program according to Addendum 22 is stored.

Each of the above embodiments has been described for the purpose of description, and is not intended to limit the scope of the present disclosure. Each of the above embodiments may be modified in various ways without departing from the scope and gist of the present disclosure. For example, some components in one embodiment are able to be added to other embodiments. In addition, some components in one embodiment are able to be replaced with corresponding components in other embodiments.

What is claimed is:

1. An etching method including:

(a) preparing a substrate, the substrate comprising a silicon-containing film and a mask, the silicon-containing film including a recess, the mask being provided on the silicon-containing film and including an opening that exposes the recess;

(b) forming a carbon-containing film on a side wall of the silicon-containing film, the side wall defining the recess; and (c) after (b), by using a plasma generated from a processing gas, forming a protective film containing tungsten on the carbon-containing film and etching the silicon-containing film in the recess, the processing gas including a fluorine-containing gas and a tungsten-containing gas, wherein the protective film containing tungsten in (c) is laminated using the carbon-containing film formed in (b) as a base.

2. The etching method according to claim 1, wherein in (b), the carbon-containing film is formed from a side wall of the mask that defines the opening to at least a portion of the side wall of the silicon-containing film.

3. The etching method according to claim 2, wherein in (b), the carbon-containing film is not formed on a bottom surface of the silicon-containing film that defines the recess.

4. The etching method according to claim 2, wherein in (b), the carbon-containing film is also formed on a bottom surface of the silicon-containing film that defines the recess.

5. The etching method according to claim 1, wherein in (b), the protective film is preferentially formed on the carbon-containing film on the side wall of the silicon-containing film.

6. The etching method according to claim 1, wherein a cycle including (b) and (c) is repeated a plurality of times.

7. The etching method according to claim 1, wherein (b) is executed in a first chamber, and (c) is executed in a second chamber different from the first chamber.

8. The etching method according to claim 7, further comprising, after (b), transporting the substrate from the first chamber to the second chamber via a transport chamber, wherein pressure inside the transport chamber is lower than pressure outside the transport chamber.

9. The etching method according to claim 7, wherein (a) includes forming the recess in the silicon-containing film in the second chamber by etching using a plasma generated from a processing gas including a fluorine-containing gas.

10. The etching method according to claim 7, wherein a temperature of a substrate support in the first chamber that supports the substrate in (b) is higher than a temperature of the substrate support in the second chamber that supports the substrate in (c).

11. The etching method according to claim 7, wherein (b) includes generating a plasma from a processing gas including a nitrogen-containing gas and generating a plasma from a processing gas containing a carbon-containing gas, and wherein the carbon-containing gas is a hydrocarbon gas.

12. The etching method according to claim 7, wherein (b) is executed by generating an inductively-coupled plasma, and (c) is executed by generating a capacitively-coupled plasma.

13. The etching method according to claim 1, wherein in (c), the fluorine-containing gas includes at least one of a hydrogen fluoride gas and a hydrofluorocarbon gas.

14. The etching method according to claim 13, wherein in (c), the processing gas further includes a phosphorus-containing gas.

15. The etching method according to claim 13, wherein in (c), the processing gas further contains a carbon-containing gas.

16. The etching method according to claim 13, wherein in (c), a temperature of a substrate support that supports the substrate is 0° C. or lower.

17. The etching method according to claim 1, wherein the silicon-containing film is a silicon oxide film, a silicon nitride film, a polycrystalline silicon film, or a film stack containing two or more of the silicon oxide film, the silicon nitride film, and the polycrystalline silicon film.

18. The etching method according to claim 1, wherein the mask is either a carbon-containing film or a metal-containing film.

19. The etching method according to claim 1, wherein the carbon-containing film is formed by generating a plasma from a CH-based gas.

20. An etching method including:

(a) preparing a substrate, the substrate comprising a silicon-containing film and a mask, the silicon-containing film including a recess, the mask being provided on the silicon-containing film and including an opening that exposes the recess;

(b) forming a carbon-containing film on a side wall of the silicon-containing film, the side wall defining the recess; and (c) by using a plasma generated from a processing gas, forming a protective film containing tungsten on the carbon-containing film and etching the silicon-containing film in the recess, the processing gas including a fluorine-containing gas and a tungsten-containing gas, wherein (b) is executed in a first chamber, and (c) is executed in a second chamber different from the first chamber.

* * * * *